United States Patent
Park et al.

(10) Patent No.: US 9,276,239 B2
(45) Date of Patent: Mar. 1, 2016

(54) METHOD FOR MANUFACTURING A FLEXIBLE DISPLAY DEVICE BY REMOVING FOREIGN PARTICLES

(71) Applicant: Samsung Display Co., Ltd., Yongin, Gyeonggi-Do (KR)

(72) Inventors: Yong-Hwan Park, Yongin (KR); Yong-Kwan Kim, Yongin (KR); Hyun-Joon Kim, Yongin (KR); In Huh, Yongin (KR); Sang-Ki Kim, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 11 days.

(21) Appl. No.: 14/174,169

(22) Filed: Feb. 6, 2014

(65) Prior Publication Data

US 2014/0217383 A1    Aug. 7, 2014

(30) Foreign Application Priority Data

Feb. 7, 2013    (KR) .................. 10-2013-0014148

(51) Int. Cl.
| | |
|---|---|
| *H01L 51/56* | (2006.01) |
| *H01L 51/52* | (2006.01) |
| *H01L 51/00* | (2006.01) |
| *H01L 27/32* | (2006.01) |

(52) U.S. Cl.
CPC ............ *H01L 51/56* (2013.01); *H01L 27/3244* (2013.01); *H01L 51/003* (2013.01); *H01L 51/0097* (2013.01); *H01L 51/5253* (2013.01); *H01L 51/5259* (2013.01); *H01L 2251/5338* (2013.01); *Y02E 10/549* (2013.01)

(58) Field of Classification Search
CPC . H01L 51/56; H01L 51/5259; H01L 51/5253; H01L 51/0097; H01L 27/3244; H01L 2251/5338; Y02E 10/549
USPC ............................................................. 438/4
See application file for complete search history.

(56) References Cited

U.S. PATENT DOCUMENTS

| | | | |
|---|---|---|---|
| 6,887,792 B2 | 5/2005 | Perlov et al. | |
| 7,259,106 B2 | 8/2007 | Jain | |
| 7,880,844 B2 | 2/2011 | Onishi et al. | |
| 8,023,097 B2 | 9/2011 | Onishi et al. | |
| 8,211,725 B2 | 7/2012 | Park et al. | |
| 2002/0142697 A1* | 10/2002 | Yamagata et al. | ............... 445/24 |
| 2004/0130517 A1* | 7/2004 | Li | ................... 345/82 |
| 2006/0214575 A1* | 9/2006 | Kajiyama et al. | ............ 313/506 |
| 2010/0140644 A1* | 6/2010 | Kai et al. | ......................... 257/98 |

(Continued)

FOREIGN PATENT DOCUMENTS

| | | |
|---|---|---|
| JP | 4260219 | 2/2009 |
| KR | 10-1097344 | 12/2011 |

*Primary Examiner* — Peter Bradford
(74) *Attorney, Agent, or Firm* — Robert E. Bushnell, Esq.

(57) ABSTRACT

A method for manufacturing a flexible display device includes: manufacturing a flexible substrate on a substrate by: forming a first organic layer on the substrate, removing foreign particles formed on the first organic layer and forming a recessed first repair groove in the first organic layer, forming a first inorganic layer on the first organic layer, forming a second organic layer on the first inorganic layer and forming a second inorganic layer on the second organic layer, forming a display for displaying an image on the flexible substrate and removing the substrate from the first organic layer.

14 Claims, 29 Drawing Sheets

(56) References Cited

U.S. PATENT DOCUMENTS

| | | | |
|---|---|---|---|
| 2011/0104842 A1* | 5/2011 | Miyazawa | 438/34 |
| 2011/0209749 A1 | 9/2011 | Yang et al. | |
| 2011/0278603 A1* | 11/2011 | Miyazawa et al. | 257/88 |
| 2011/0287682 A1* | 11/2011 | Miyazawa et al. | 445/2 |
| 2012/0164761 A1* | 6/2012 | Yamazaki et al. | 438/15 |
| 2012/0270460 A1* | 10/2012 | Miyazawa | 445/2 |

* cited by examiner ated Serial No. 10-2013-0014148.

METHOD FOR MANUFACTURING A FLEXIBLE DISPLAY DEVICE BY REMOVING FOREIGN PARTICLES

CLAIM PRIORITY

This application makes reference to, incorporates the same herein, and claims all benefits accruing under 35 U.S.C. §119 from an application earlier filed in the Korean Intellectual Property Office on 7 Feb. 2013 and there duly assigned Serial No. 10-2013-0014148.

BACKGROUND OF THE INVENTION (a) Field of the Invention

The present invention generally relates to a flexible substrate, a method for manufacturing a flexible substrate, a flexible display device, and a method for manufacturing a flexible display device.

(b) Description of the Related Art

A display device is a device displaying images, and recently, a display device including an organic light emitting diode has received attention.

Since the organic light emitting diode has a self-emission characteristic and does not require a separate light source, unlike a liquid crystal display device, a thickness and a weight of the entire display device may be reduced. Further, the organic light emitting diode has high-quality characteristics such as low power consumption, high luminance, and a high response speed.

The above information disclosed in this Related Art section is only for enhancement of understanding of the background of the invention and therefore it may contain information that does not form the prior art that is already known in this country to a person of ordinary skill in the art.

SUMMARY OF THE INVENTION

The present invention has been made in an effort to provide a flexible substrate for controlling generation of defects, a method for manufacturing a flexible substrate, a flexible display device, and a method for manufacturing a flexible display device.

An exemplary embodiment of the present invention provides a method for manufacturing a flexible substrate including: forming a first organic layer on a substrate; removing foreign particles formed on the first organic layer and forming a recessed first repair groove in the first organic layer; forming a first inorganic layer on the first organic layer; forming a second organic layer on the first inorganic layer; and forming a second inorganic layer on the second organic layer.

The removing of foreign particles may be performed by irradiating laser beams on the first organic layer.

The forming of the first organic layer on the substrate may be performed by coating an organic material on the substrate.

The forming of the first inorganic layer on the first organic layer may be performed by depositing an inorganic material on the first organic layer.

The method further includes filling the first repair groove with a repair material.

Another embodiment of the present invention provides a method for manufacturing a flexible display device including: manufacturing a flexible substrate by using the method for manufacturing a flexible substrate; forming a display for displaying an image on the flexible substrate; and removing the substrate from the first organic layer.

The forming of a display may be performed by forming an organic light emitting diode on the flexible substrate.

Another embodiment of the present invention provides a flexible substrate including: a first organic layer including a recessed first repair groove; a first inorganic layer provided on the first organic layer; a second organic layer provided on the first inorganic layer; and a second inorganic layer provided on the second organic layer.

A part of each of the first inorganic layer and the second organic layer may be provided inside the first repair groove.

The first organic layer and the second organic layer respectively include an organic material.

The first inorganic layer and the second inorganic layer respectively include an inorganic material.

The flexible substrate further includes a repair material for filling the first repair groove.

Another embodiment of the present invention provides a flexible display device including: the flexible substrate; and a display provided on the flexible substrate and displaying an image.

The display includes an organic light emitting diode.

Another embodiment of the present invention provides a method for manufacturing a flexible substrate including: forming a first organic layer on a substrate; forming a first inorganic layer on the first organic layer; forming a recessed first repair groove in the first organic layer and a first repair hole for exposing the first repair groove in the first inorganic layer by removing foreign particles provided on the first inorganic layer; forming a second organic layer on the first inorganic layer; and forming a second inorganic layer on the second organic layer.

The removing of foreign particles may be performed by irradiating laser beams on the first inorganic layer.

The method further includes filling the first repair groove with a repair material.

Another embodiment of the present invention provides a method for manufacturing a flexible display device including: manufacturing a flexible substrate according to the method for manufacturing a flexible substrate; forming a display for displaying an image on the flexible substrate; and removing the substrate from the first organic layer.

Another embodiment of the present invention provides a flexible substrate including: a first organic layer including a recessed first repair groove; a first inorganic layer provided on the first organic layer and including a first repair hole for exposing the first repair groove; a second organic layer provided on the first inorganic layer; and a second inorganic layer provided on the second organic layer.

A part of the second organic layer may be provided inside the first repair groove through the first repair hole.

The flexible substrate further includes a repair material for filling the first repair groove.

Another embodiment of the present invention provides a flexible display device including: the flexible substrate; and a display provided on the flexible substrate and displaying an image.

Another embodiment of the present invention provides a method for manufacturing a flexible substrate including: forming a first organic layer on a substrate; forming a first inorganic layer on the first organic layer; forming a second organic layer on the first inorganic layer; forming a second inorganic layer on the second organic layer; and forming a recessed second repair groove in the second organic layer and a second repair hole for exposing the second repair groove in the second inorganic layer by removing the bubbles formed on the second inorganic layer.

The removing of bubbles may be performed by irradiating laser beams on the second inorganic layer.

The method further includes filling the second repair groove with a repair material.

Another embodiment of the present invention provides a method for manufacturing a flexible display device including: manufacturing a flexible substrate according to the method for manufacturing a flexible substrate; forming a display for displaying an image on the flexible substrate; and removing the substrate from the first organic layer.

Another embodiment of the present invention provides a flexible substrate including: a first organic layer; a first inorganic layer provided on the first organic layer; a second organic layer provided on the first inorganic layer and including a recessed second repair groove; and a second inorganic layer provided on the second organic layer and including a second repair hole for exposing the second repair groove.

The flexible substrate further includes a repair material for filling the second repair groove.

Another embodiment of the present invention provides a flexible display device including: the flexible substrate; and a display provided on the flexible substrate and displaying an image.

Another embodiment of the present invention provides a method for manufacturing a flexible display device including: forming a first organic layer on a substrate; forming a first inorganic layer on the first organic layer; forming a second organic layer on the first inorganic layer; forming a second inorganic layer on the second organic layer; forming a polysilicon layer on the second inorganic layer; removing bubbles formed on the polysilicon layer and forming a recessed second repair groove in the second organic layer, a second repair hole for exposing the second repair groove in the second inorganic layer, and a third repair hole for exposing the second repair groove in the polysilicon layer; forming an active layer by patterning the polysilicon layer; forming an organic light emitting diode connected to the active layer; and removing the substrate from the first organic layer.

The removing of bubbles may be performed by irradiating laser beams on the polysilicon layer.

The method further includes filling the second repair groove with a repair material.

Another embodiment of the present invention provides a flexible display device including: a flexible substrate including a first organic layer, a first inorganic layer provided on the first organic layer, a second organic layer provided on the first inorganic layer and including a recessed second repair groove, and a second inorganic layer provided on the second organic layer and including a second repair hole for exposing the second repair groove; an active layer provided on the flexible substrate and including a polysilicon layer; and an organic light emitting diode connected to the active layer.

The flexible display device further includes a repair material for filling the second repair groove.

According to the embodiments of the present invention, the flexible substrate for controlling generation of defects, the method for manufacturing a flexible substrate, the flexible display device, and the method for manufacturing a flexible display device are provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
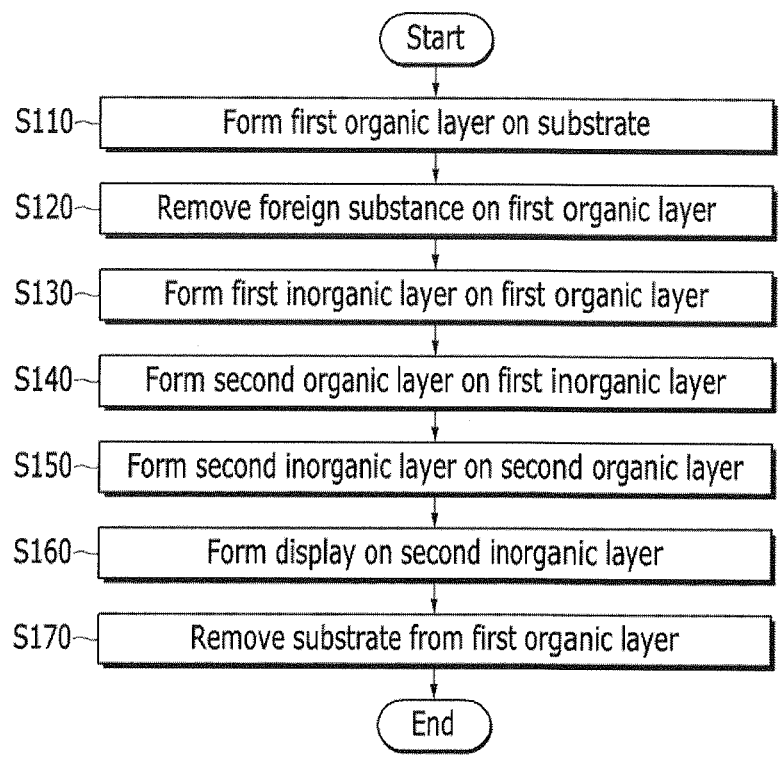
FIG. 1 shows a flowchart of a method for manufacturing a flexible display device according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive and like reference numerals designate like elements throughout the specification.

Elements will be representatively explained in the first exemplary embodiment using reference numerals, and in the remaining embodiments, elements different from the first exemplary embodiment will be explained.

The size and the thickness of each element in the drawing are random samples for better understanding and ease of description, and the present invention is not limited thereto.

In the drawings, the thickness of layers, films, panels, regions, etc., are exaggerated for clarity. The thickness of the layers, films, panels, regions, etc., is enlarged in the drawings for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

In general, an organic light emitting diode (OLED) display includes a substrate, an organic light emitting diode provided on the substrate, and an encapsulator for encapsulating the organic light emitting diode with the substrate having the organic light emitting diode therebetween.

The substrate employed in an OLED may be a flexible substrate that makes the display bendable. However, when a defect occurs on the flexible substrate, moisture may permeate into the organic light emitting diode through a defect-generated part to reduce the life-span of the organic light emitting diode (OLED) display.

Referring to FIG. 1 to FIG. 5, a method for manufacturing a flexible display device according to a first exemplary embodiment of the present invention will now be described.

FIG. 1 shows a flowchart of a method for manufacturing a flexible display device according to a first exemplary embodiment of the present invention. FIG. 2 to FIG. 5 show a method for manufacturing a flexible display device according to a first exemplary embodiment of the present invention.

Figure 2:
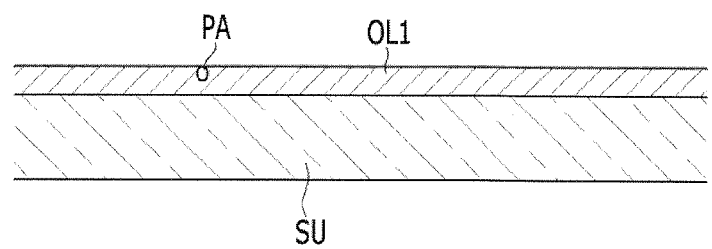
FIG. 2 to FIG. 5 show a method for manufacturing a flexible display device according to a first exemplary embodiment of the present invention.

As shown in FIG. 1 and FIG. 2, a first organic layer (OL1) may be formed on a substrate (SU) (S110).

In detail, the first organic layer (OL1) may be formed by coating an organic material on the substrate (SU) made of glass, metal, or ceramic according to a coating process such as spin coating, slit coating, or inkjet coating. The first organic layer (OL1) may be made of polymers, and it can be a single layer or multilayers including at least one of polyethylene terephthalate, polyimide, polycarbonate, epoxy, polyethylene, and polyacrylate which are organic materials. In this instance, foreign particles (PA) such as undesired particles can be provided on a surface of the first organic layer (OL1) or inside the same.

Figure 3:
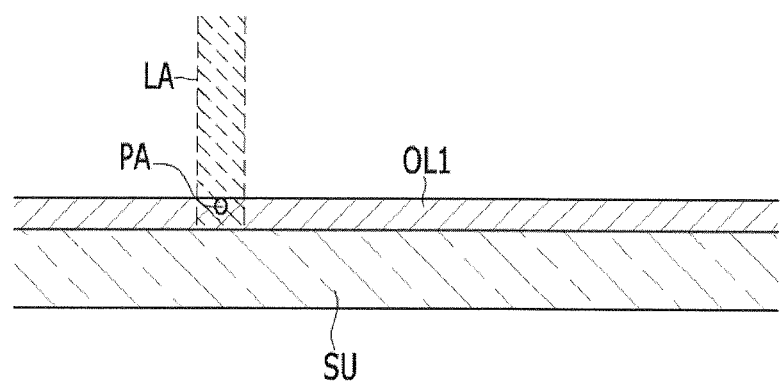
Figure 4:
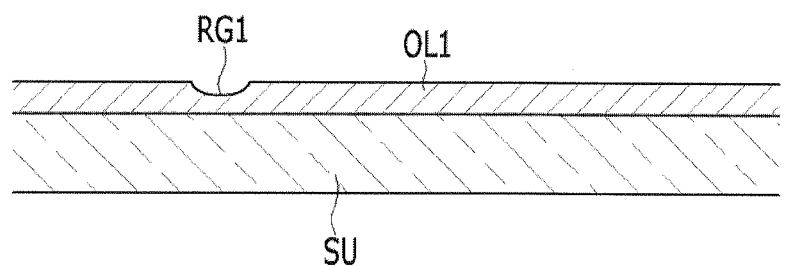

As shown in FIG. 3 and FIG. 4, a recessed first repair groove (RG1) may be formed on the first organic layer (OL1) by removing foreign particles (PA) from the first organic layer (OL1) (S120).

In detail, the first organic layer (OL1) may be tested by using a foreign particle testing device including a CCD whether there are foreign particles (PA) on the first organic layer (OL1), and when the foreign particles (PA) are found on the first organic layer (OL1), laser beams (LA) are irradiated on a part of the first organic layer (OL1) where the foreign particles (PA) are provided to thus remove the foreign particles (PA) from the first organic layer (OL1). Therefore, the recessed first repair groove (RG1) is formed on the part of the first organic layer (OL1) on which the foreign particles (PA) were provided.

Figure 5:
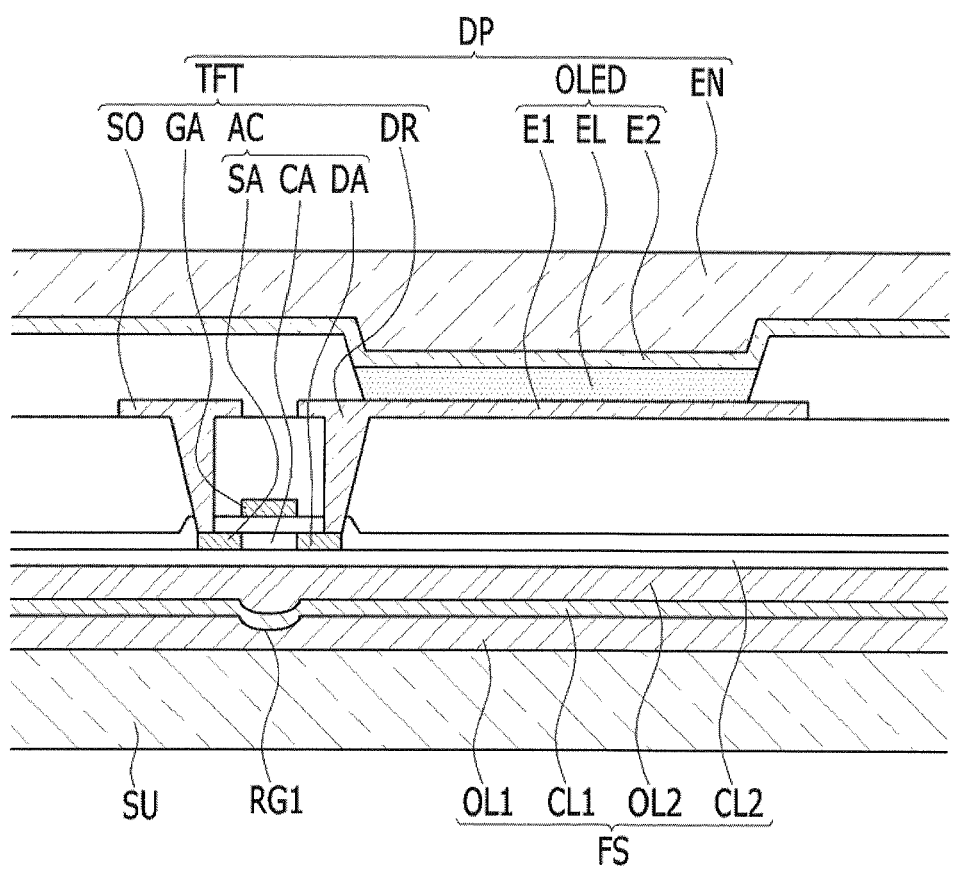

As shown in FIG. 5, a first inorganic layer (CL1) may be formed on the first organic layer (OL1) (S130).

In detail, an inorganic material may be deposited as a layer on the first organic layer (OL1) in which the first repair groove (RG1) may be formed by using a deposition process such as a sputtering method or a chemical vapor deposition method to thus form the first inorganic layer (CL1). The first inorganic layer (CL1) may be a single layer or multilayers including a metal oxide or metal nitride. In detail, the first inorganic layer (CL1) includes at least one of $SiN_x$, $Al_2O_3$, $SiO_2$, and $TiO_2$. The first inorganic layer (CL1) is thinner than the first organic layer (OL1) so a part of the first inorganic layer (CL1) corresponding to the first repair groove (RG1) has a recessed shape corresponding to the first repair groove (RG1).

A second organic layer (OL2) may be formed on the first inorganic layer (CL1) (S140).

In detail, an organic material may be coated as a layer on the first inorganic layer (CL1) by using a coating process such as spin coating, slit coating, or inkjet coating to thus form the second organic layer (OL2). The second organic layer (OL2) may be made of polymers, and it can be a single layer or multilayers including at least one of polyethylene terephthalate, polyimide, polycarbonate, epoxy, polyethylene, and polyacrylate. The second organic layer (OL2) may be thicker than the first inorganic layer (CL1) so a part of the recessed first inorganic layer (CL1) may be filled with the second organic layer (OL2) corresponding to the first repair groove (RG1).

A second inorganic layer (CL2) may be formed on the second organic layer (OL2) (S150).

In detail, an inorganic material may be deposited as a layer on the second organic layer (OL2) by using the deposition process such as the sputtering method or the chemical vapor deposition method to thus form the second inorganic layer (CL2). The second inorganic layer (CL2) may be a single layer or multilayers including a metal oxide or metal nitride. In detail, the second inorganic layer (CL2) includes at least one of $SiN_x$, $Al_2O_3$, $SiO_2$, and $TiO_2$. A part of the recessed first inorganic layer (CL1) may be filled corresponding to the first repair groove (RG1) by the second organic layer (OL2) so the second inorganic layer (CL2) may be flat on the second organic layer (OL2).

A flexible substrate (FS) may be formed according to the above-noted method.

A display (DP) may be formed on the second inorganic layer (CL2) (S160).

In detail, a process for forming a thin film transistor may be applied to the second inorganic layer (CL2) of the flexible substrate (FS) to form an active layer (AC) including a source area (SA), a channel area (CA), and a drain area (DA) and a plurality of thin film transistors (TFT) including a gate electrode (GA), a source electrode (SO), and a drain electrode (DR), an organic light emitting diode (OLED) including a first electrode (E1), an organic emission layer (EL), and a second electrode (E2) connected to the thin film transistor (TFT) may be then formed, and a thin-film encapsulator (EN) for encapsulating the organic light emitting diode (OLED) may be formed so the display (DP) for displaying images is formed.

The display (DP) may be configured with a plurality of thin film transistors (TFT), the organic light emitting diode (OLED), and the thin-film encapsulator (EN) in the first exemplary embodiment of the present invention, and the display can be configured in various manners by a skilled person in the art in another exemplary embodiment of the present invention.

Meanwhile, a plurality of the display (DP) can be formed on the substrate (SU). The plurality of the display (DP) can be divided into an individual display (DP) by a process for cutting the substrate. As a result, a display panel can include the individual display (DP) disposed on the cut-substrate.

The substrate (SU) may be removed from the first organic layer (OL1) (S170).

In detail, laser beams are irradiated between the first organic layer (OL1) and the substrate (SU) and the first organic layer (OL1) may be separated from the substrate (SU) to remove the substrate (SU) from the first organic layer (OL1), or the substrate (SU) may be etched to remove the substrate (SU) from the first organic layer (OL1).

A flexible display device according to a second exemplary embodiment of the present invention to be described is manufactured according to the above-described process.

When the first organic layer (OL1) included in the initial flexible substrate (FS) is formed and the foreign particles (PA) are included in the first organic layer (OL1), the method for manufacturing a flexible display device according to the first exemplary embodiment of the present invention removes the foreign particles (PA) from the first organic layer (OL1) by using the laser beams (LA) to prevent generation of bubbles on the first organic layer (OL1) caused by the foreign particles (PA) or generation of defects on the flexible substrate (FS) caused by cracks on the first inorganic layer (CL1). The generation of defects on the flexible substrate (FS) may be controlled to prevent permeation of external moisture into the organic light emitting diode (OLED) caused by the defects generated on the flexible substrate (FS) and improve the life-span of the flexible display device.

That is, the method for manufacturing a flexible display device with improved life-span according to the first exemplary embodiment of the present invention is provided.

Figure 6:
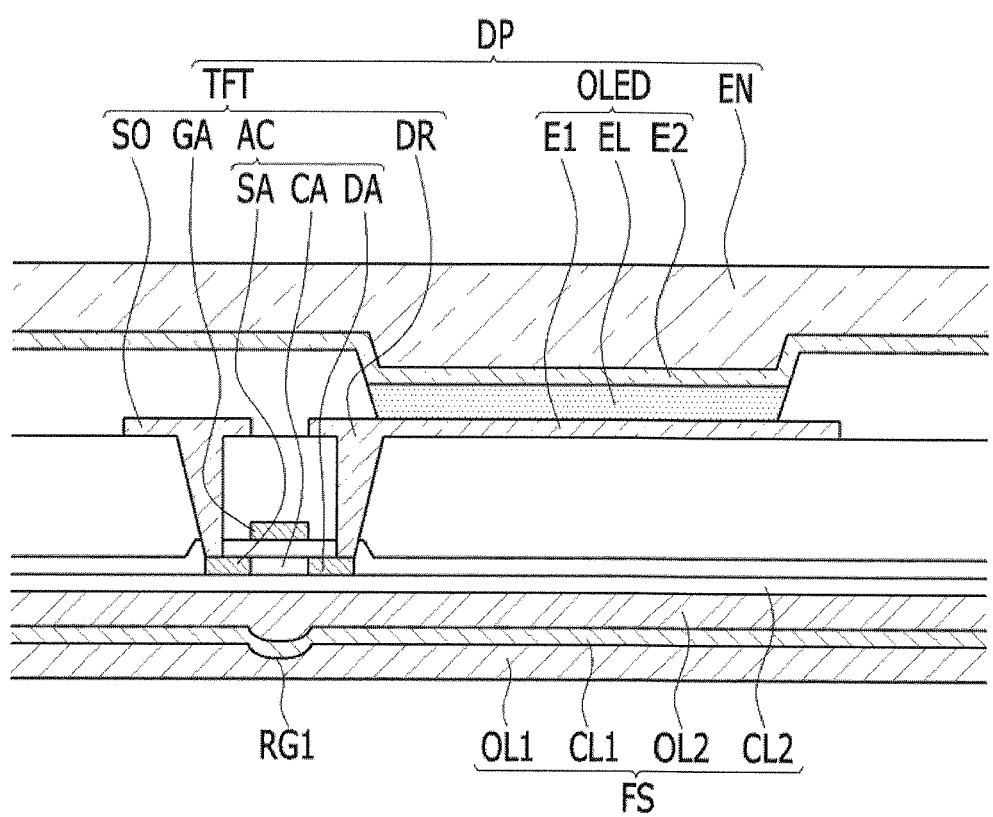
FIG. 6 shows a flexible display device according to a second exemplary embodiment of the present invention.

Referring to FIG. 6, a flexible display device according to a second exemplary embodiment of the present invention will now be described. The flexible display device according to the second exemplary embodiment of the present invention can be manufactured by using the method for manufacturing a flexible display device according to the second exemplary embodiment of the present invention.

FIG. 6 shows a flexible display device according to a second exemplary embodiment of the present invention.

As shown in FIG. 6, the flexible display device 1002 according to the second exemplary embodiment of the present invention is flexible and includes a flexible substrate (FS) and a display (DP).

The flexible substrate (FS) includes a first organic layer (OL1), a first inorganic layer (CL1), a second organic layer (OL2), and a second inorganic layer (CL2).

The first organic layer (OL1) can be a single layer or multilayers including at least one of polyethylene terephthalate, polyimide, polycarbonate, epoxy, polyethylene, and polyacrylate, and it includes a recessed first repair groove (RG1).

The first inorganic layer (CL1) may be provided on the first organic layer (OL1), and may be a single layer or multilayers including at least one of SiNx, $Al_2O_3$, $SiO_2$, and $TiO_2$ which are inorganic materials. The first inorganic layer (CL1) may be thinner than the first organic layer (OL1), and a part of the first inorganic layer (CL1) may be provided inside the first repair groove (RG1).

The second organic layer (OL2) may be provided on the first inorganic layer (CL1), and it can be a single layer or multilayers including at least one of polyethylene terephthalate, polyimide, polycarbonate, epoxy, polyethylene, and polyacrylate. The second organic layer (OL2) may be thicker than the first inorganic layer (CL1), and a part of the second organic layer (OL2) may be provided inside the first repair groove (RG1) together with a part of the first inorganic layer (CL1). The second organic layer (OL2) and the first inorganic layer (CL1) are provided in the first repair groove (RG1) so the first repair groove (RG1) of the first organic layer (OL1) is filled by the first inorganic layer (CL1) and the second organic layer (OL2).

The second inorganic layer (CL2) may be provided on the second organic layer (OL2), and may be a single layer or multilayers including at least one of SiNx, $Al_2O_3$, $SiO_2$, and $TiO_2$ which are inorganic materials. The second inorganic layer (CL2) may be flat on the second organic layer (OL2).

The display (DP) may be provided on the flexible substrate (FS) and displays an image. The display (DP) includes an active layer (AC) having a source area (SA), a channel area (CA), and a drain area (DA); a plurality of thin film transistors (TFTs) having a gate electrode (GA), a source electrode (SO), and a drain electrode (DR); an organic light emitting diode (OLED) having a first electrode (E1), an organic emission layer (EL), and a second electrode (E2); and a thin-film encapsulator (EN) for sealing the organic light emitting diode (OLED) together with the flexible substrate (FS). The display (DP) has various types known to a person skilled in the art.

As described, when forming the first organic layer (OL1) included in the initial flexible substrate (FS), the flexible display device 1002 according to the second exemplary embodiment of the present invention removes the foreign particles (PA) from the first organic layer (OL1) by using the laser beams (LA) when the foreign particles (PA) are included in the first organic layer (OL1), and the first organic layer (OL1) includes the first repair groove (RG1) thereby preventing generation of defects on the flexible substrate (FS) caused by generation of bubbles on the first organic layer (OL1) by the foreign particles (PA) or generation of cracks on the first inorganic layer (CL1). The generation of defects on the flexible substrate (FS) may be controlled to prevent permeation of external moisture into the organic light emitting diode (OLED) caused by the defects generated on the flexible substrate (FS) and improve the life-span of the flexible display device 1002.

That is, when the foreign particles (PA) are provided on the first organic layer (OL1) of the initial flexible substrate (FS), the flexible display device 1002 according to the second exemplary embodiment of the present invention from which the foreign particles (PA) are removed and of which the life-span is improved is provided.

Figure 7:
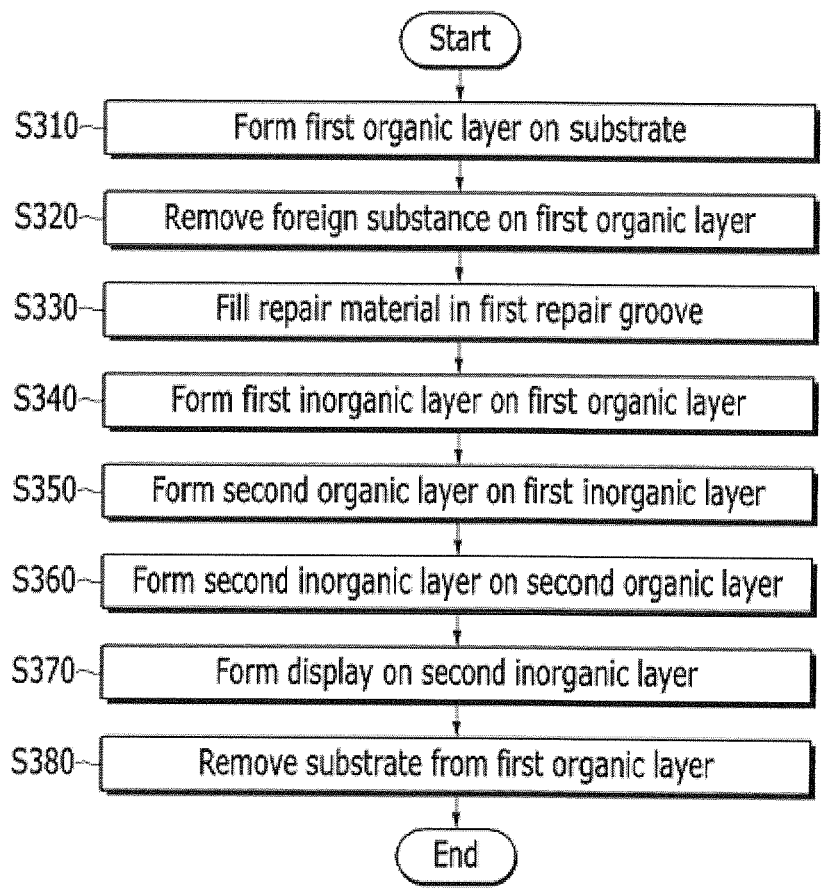
FIG. 7 shows a method for manufacturing a flexible display device according to a third exemplary embodiment of the present invention.
Figure 8:
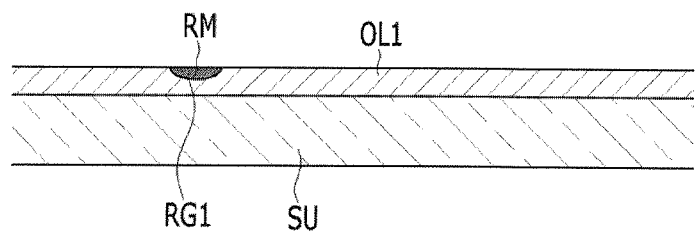
FIG. 8 and FIG. 9 show a method for manufacturing a flexible display device according to a third exemplary embodiment of the present invention.
Figure 9:
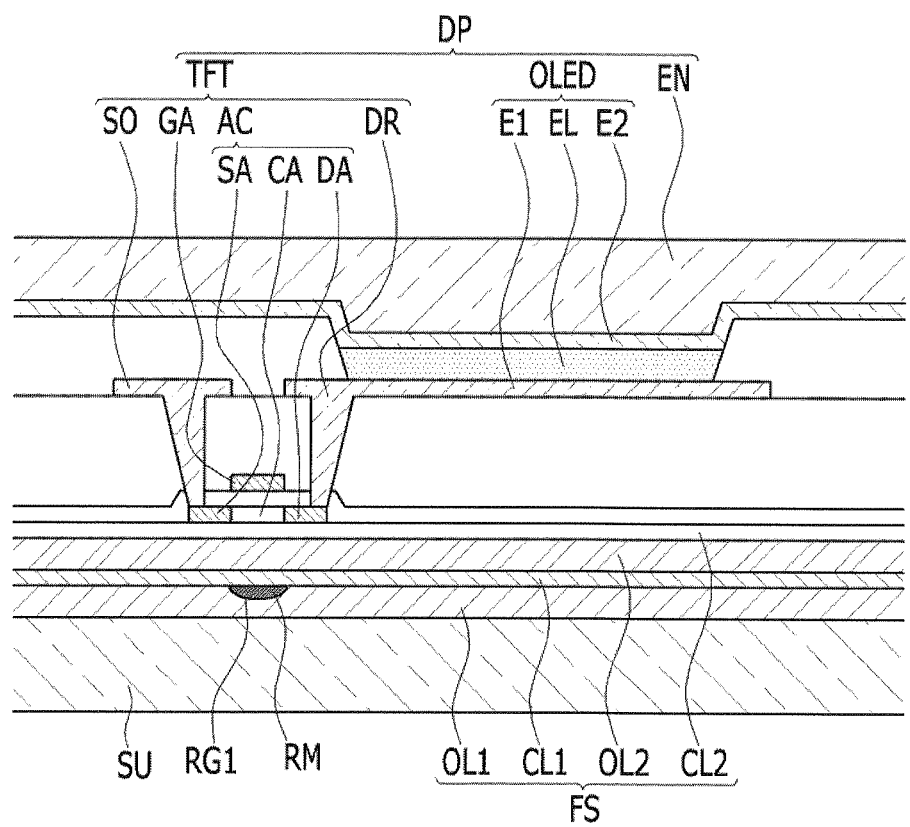

Referring to FIG. 7 to FIG. 9, a method for manufacturing a flexible display device according to a third exemplary embodiment of the present invention will now be described.

Parts that are different from the first exemplary embodiment will be described, and parts that are omitted follow the first exemplary embodiment. For better comprehension and ease of description, the same constituent elements as the first exemplary embodiment of the present invention will use the same reference numerals in the third exemplary embodiment of the present invention.

FIG. 7 shows a method for manufacturing a flexible display device according to a third exemplary embodiment of the present invention. FIG. 8 and FIG. 9 show a method for manufacturing a flexible display device according to a third exemplary embodiment of the present invention.

As shown in FIG. 7 and FIG. 8, the first organic layer (OL1) may be formed on the substrate (SU) (S310).

A recessed first repair groove (RG1) may be formed in the first organic layer (OL1) by removing the foreign particles (PA) provided on the first organic layer (OL1) (S320).

A repair material (RM) may be filled in the first repair groove (RG1) (S330).

In detail, the repair material (RM) including a metal, an organic material, or an inorganic material may be filled in the recessed first repair groove (RG1) by using the coating process or the deposition process. Therefore, a first inorganic layer (CL1), a second organic layer (OL2), and a second inorganic layer (CL2) formed on the repair material (RM) afterwards are formed to be flat.

As shown in FIG. 9, the first inorganic layer (CL1) may be formed on the first organic layer (OL1) (S340).

The second organic layer (OL2) may be formed on the first inorganic layer (CL1) (S350).

The second inorganic layer (CL2) may be formed on the second organic layer (OL2) (S360).

The flexible substrate (FS) is formed according to the above-noted method.

A display (DP) may be formed on the second inorganic layer (CL2) (S370).

As described above, a plurality of the display (DP) can be formed on the substrate (SU). The plurality of the display (DP) can be divided into an individual display (DP) by a process for cutting the substrate. As a result, a display panel can include the individual display (DP) disposed on the cut-substrate.

The substrate (SU) may be removed from the first organic layer (OL1) (S380).

A flexible display device according to a fourth exemplary embodiment of the present invention to be described is manufactured by the above-noted process.

As described, when the first organic layer (OL1) included in the initial flexible substrate (FS) may be formed and the foreign particles (PA) are included in the first organic layer (OL1), the method for manufacturing a flexible display device according to the third exemplary embodiment of the present invention removes the foreign particles (PA) from the first organic layer (OL1) by using the laser beams (LA) and fills the first repair groove (RG1) that may be formed in the removed part with the repair material (RM), thereby preventing generation of defects on the flexible substrate (FS) caused by generation of bubbles on the first organic layer (OL1) by the foreign particles (PA) or generation of cracks on the first inorganic layer (CL1). The generation of defects on the flexible substrate (FS) may be controlled to prevent permeation of external moisture into the organic light emitting diode (OLED) caused by the defects generated on the flexible substrate (FS) and improve the life-span of the flexible display device.

That is, the method for manufacturing a flexible display device with improved life-span according to the third exemplary embodiment of the present invention is provided.

Figure 10:
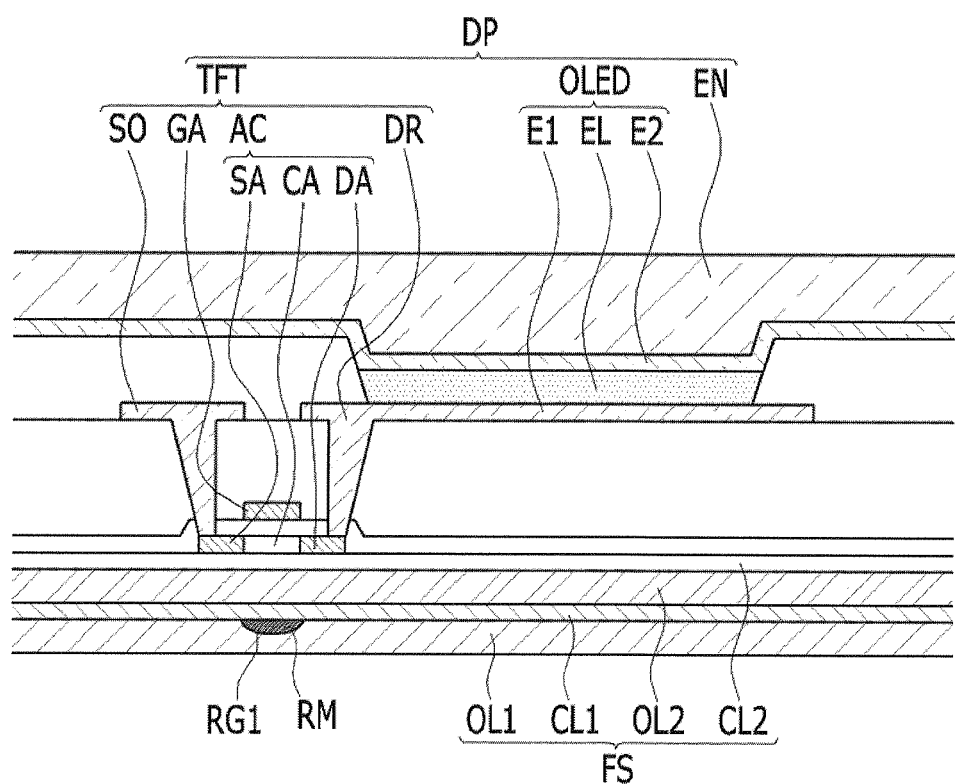
FIG. 10 shows a flexible display device according to a fourth exemplary embodiment of the present invention.

Referring to FIG. 10, a flexible display device according to a fourth exemplary embodiment of the present invention will now be described. The flexible display device according to the fourth exemplary embodiment of the present invention can be manufactured by using the method for manufacturing a flexible display device according to the third exemplary embodiment of the present invention.

Parts that are different from the second exemplary embodiment will be described, and parts that are omitted follow the second exemplary embodiment. For better comprehension and ease of description, the same constituent elements as the second exemplary embodiment of the present invention will use the same reference numerals in the fourth exemplary embodiment of the present invention.

FIG. 10 shows a flexible display device according to a fourth exemplary embodiment of the present invention.

As shown in FIG. 10, the flexible display device 1004 according to the fourth exemplary embodiment of the present invention is flexible and includes a flexible substrate (FS) and a display (DP).

The flexible substrate (FS) includes a first organic layer (OL1), a first inorganic layer (CL1), a second organic layer (OL2), a second inorganic layer (CL2), and a repair material (RM).

The repair material (RM) fills the first repair groove (RG1) formed in the first organic layer (OL1), and it includes a metal, an organic material, or an inorganic material. Therefore, the first inorganic layer (CL1), the second organic layer (OL2), and the second inorganic layer (CL2) provided on the repair material (RM) are flat.

As described, when the first organic layer (OL1) included in the initial flexible substrate (FS) is formed and the foreign particles (PA) are included in the first organic layer (OL1), the flexible display device 1004 according to the fourth exemplary embodiment of the present invention removes the foreign particles (PA) from the first organic layer (OL1) by using the laser beams (LA), the first organic layer (OL1) includes the first repair groove (RG1), and the first repair groove (RG1) may be filled with the repair material (RM) thereby preventing generation of defects on the flexible substrate (FS) caused by generation of bubbles on the first organic layer (OL1) by the foreign particles (PA) or generation of cracks on the first inorganic layer (CL1). The generation of defects on the flexible substrate (FS) may be controlled to prevent permeation of external moisture into the organic light emitting diode (OLED) caused by the defects generated on the flexible substrate (FS) and improve the life-span of the flexible display device 1004.

That is, the flexible display device 1004 from which the foreign particles (PA) are removed and of which the life-span is improved when the foreign particles (PA) are provided on the first organic layer (OL1) of the initial flexible substrate (FS) according to the fourth exemplary embodiment of the present invention is provided.

Referring to FIG. 11 to FIG. 15, a method for manufacturing a flexible display device according to a fifth exemplary embodiment of the present invention will now be described.

Parts that are different from the first exemplary embodiment will be described, and parts that are omitted follow the first exemplary embodiment. For better comprehension and ease of description, the same constituent elements as the first exemplary embodiment of the present invention will use the same reference numerals in the fifth exemplary embodiment of the present invention.

Figure 11:
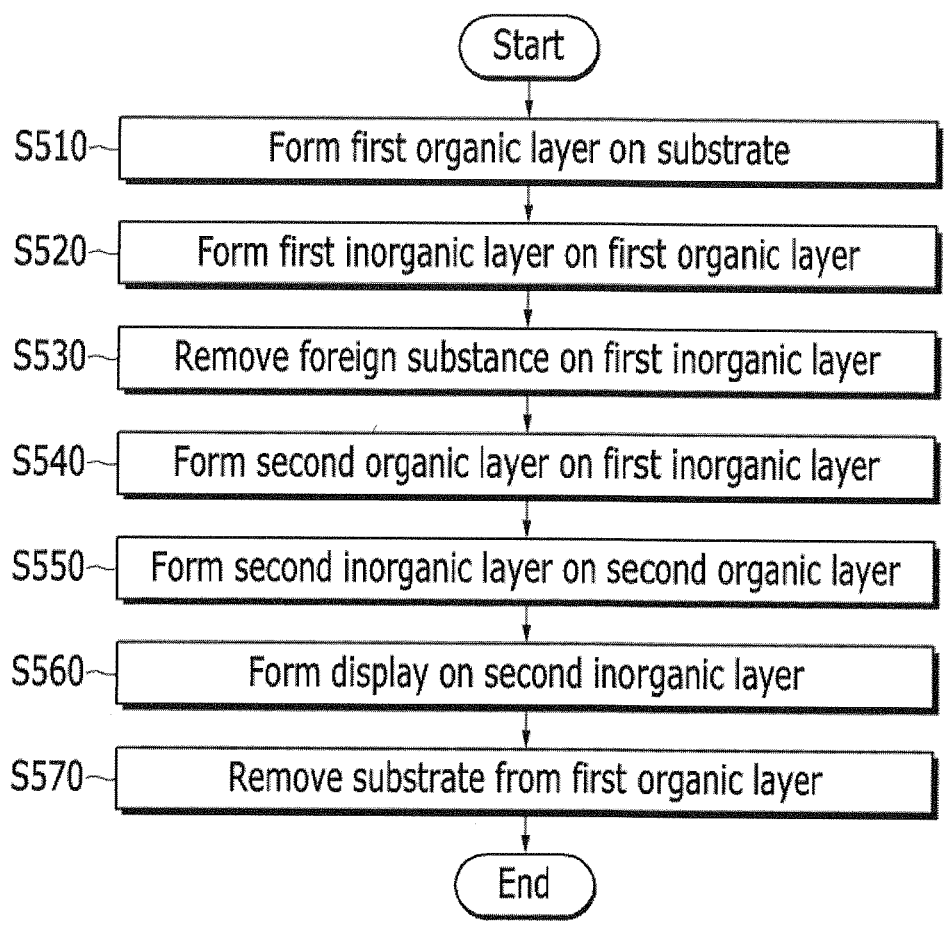
FIG. 11 shows a flowchart of a method for manufacturing a flexible display device according to a fifth exemplary embodiment of the present invention.

FIG. 11 shows a flowchart of a method for manufacturing a flexible display device according to a fifth exemplary embodiment of the present invention. FIG. 12 to FIG. 15 show a method for manufacturing a flexible display device according to a fifth exemplary embodiment of the present invention.

Figure 12:
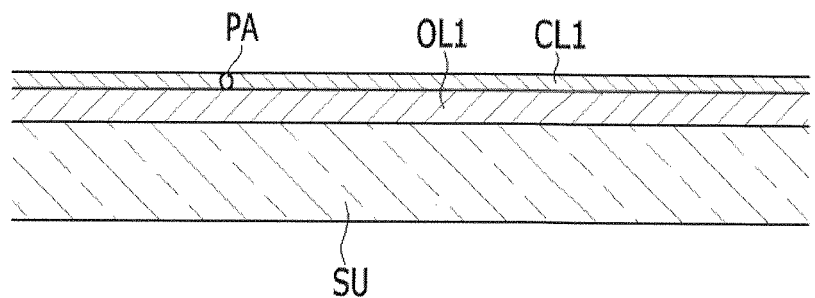
FIG. 12 to FIG. 15 show a method for manufacturing a flexible display device according to a fifth exemplary embodiment of the present invention.

As shown in FIG. 11 and FIG. 12, a first organic layer (OL1) may be formed on a substrate (SU) (S510).

A first inorganic layer (CL1) may be formed on the first organic layer (OL1) (S520).

In detail, the first inorganic layer (CL1) may be formed on the first organic layer (OL1) in which the first repair groove (RG1) may be formed by depositing an inorganic material as a layer by using the deposition process such as the sputtering method or chemical vapor deposition method. The first inorganic layer (CL1) may be a single layer or multilayers including a metal oxide or metal nitride. In detail, the first inorganic layer (CL1) includes at least one of SiNx, $Al_2O_3$, $SiO_2$, and $TiO_2$. In this instance, foreign particles (PA) such as undesired particles can be provided on the surface of the first inorganic layer (CL1) or inside it.

Figure 13:
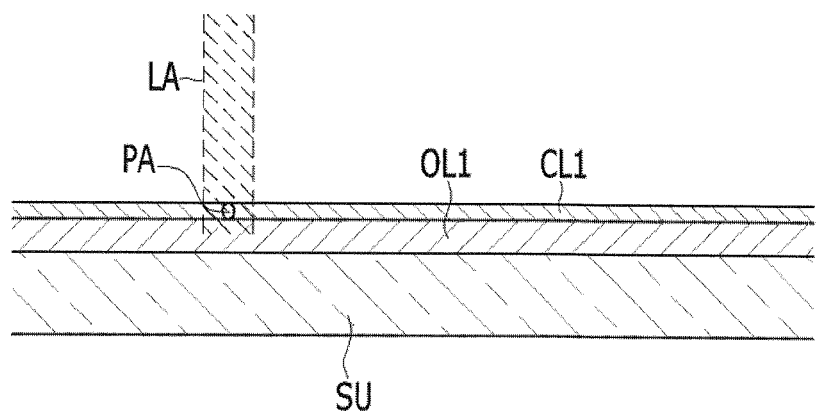
Figure 14:
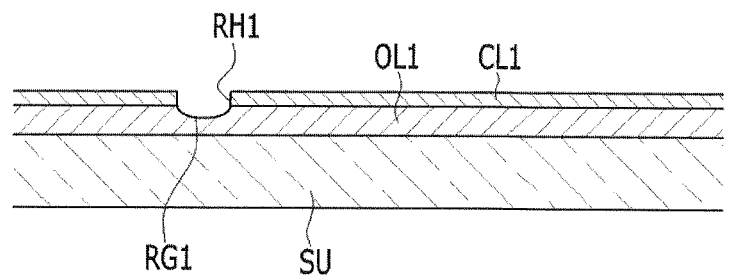

As shown in FIG. 13 and FIG. 14, a recessed first repair groove (RG1) may be formed in the first organic layer (OL1) and a first repair hole (RH1) for exposing the first repair groove (RG1) may be formed in the first inorganic layer (CL1) by removing the foreign particles (PA) that are provided on the first inorganic layer (CL1) (S530).

In detail, it is tested by using a foreign particle testing device including a CCD whether there are foreign particles (PA) on the first inorganic layer (CL1), and when the foreign particles (PA) are found on the first inorganic layer (CL1), laser beams (LA) are irradiated on a part of the first inorganic layer (CL1) where the foreign particles (PA) are provided to thus remove the foreign particles (PA) from the first inorganic layer (CL1). Therefore, the first repair hole (RH1) may be formed in a part of the first inorganic layer (CL1) on which the foreign particles (PA) were provided, and the recessed first repair groove (RG1) may be formed in the first organic layer (OL1) corresponding to the first repair hole (RH1).

Figure 15:
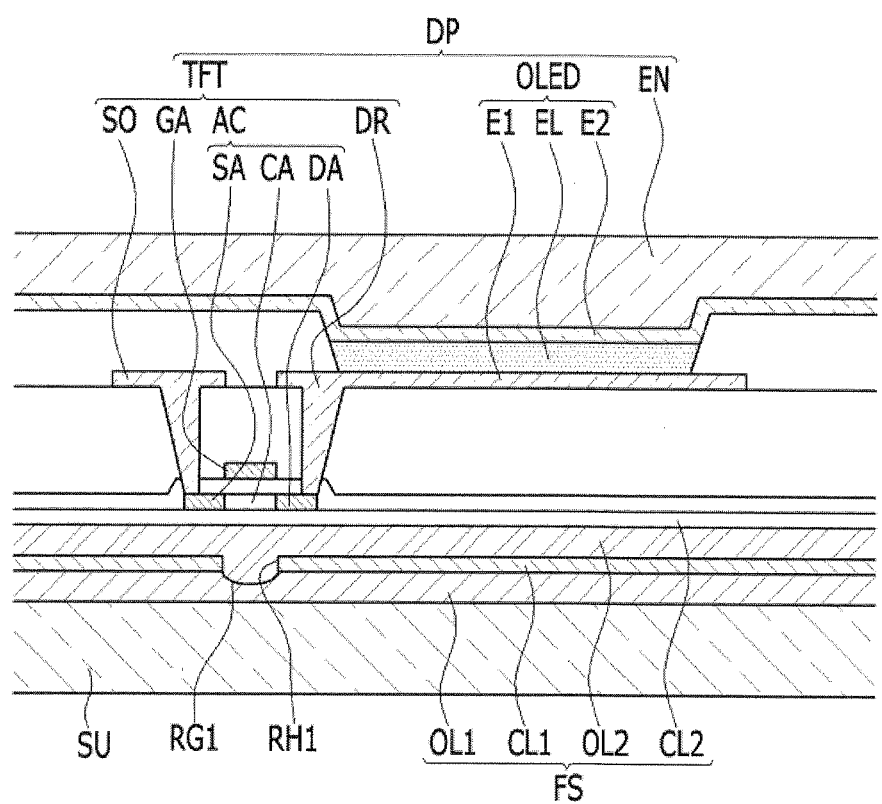

As shown in FIG. 15, a second organic layer (OL2) may be formed on the first inorganic layer (CL1) (S540).

In detail, an organic material may be coated as a layer on the first inorganic layer (CL1) by using a coating process such as spin coating, slit coating, or inkjet coating to thus form the second organic layer (OL2). The second organic layer (OL2) may be made of polymers, and it can be a single layer or multilayers including at least one of polyethylene terephthalate, polyimide, polycarbonate, epoxy, polyethylene, and polyacrylate. The second organic layer (OL2) may be thicker than the first inorganic layer (CL1) so the first repair hole (RH1) of the first inorganic layer (CL1) and the first repair groove (RG1) of the first organic layer (OL1) are filled by the second organic layer (OL2).

A second inorganic layer (CL2) may be formed on the second organic layer (OL2) (S550).

In detail, the second inorganic layer (CL2) may be formed on the second organic layer (OL2) by depositing an inorganic material as a layer by using the deposition process such as the sputtering method or the chemical vapor deposition method. The second inorganic layer (CL2) may be a single layer or multilayers including a metal oxide or metal nitride. In detail, the second inorganic layer (CL2) includes at least one of SiNx, $Al_2O_3$, $SiO_2$, and $TiO_2$. The first repair groove (RG1) and the first repair hole (RH1) are filled by the second organic layer (OL2) so the second inorganic layer (CL2) may be flat on the second organic layer (OL2).

The flexible substrate (FS) may be formed according to the above-noted method.

A display (DP) may be formed on the second inorganic layer (CL2) (S560).

As described above, a plurality of the display (DP) can be formed on the substrate (SU). The plurality of the display (DP) can be divided into an individual display (DP) by a process for cutting the substrate. As a result, a display panel can include the individual display (DP) disposed on the cut-substrate.

The substrate (SU) may be removed from the first organic layer (OL1) (S570).

According to the process, a flexible display device according to a sixth exemplary embodiment of the present invention to be described is manufactured.

As described, when the first inorganic layer (CL1) included in the initial flexible substrate (FS) may be formed and the foreign particles (PA) are included in the first inorganic layer (CL1), the method for manufacturing a flexible display device according to the fifth exemplary embodiment of the present invention removes the foreign particles (PA) from the first inorganic layer (CL1) by using the laser beams (LA) thereby preventing generation of defects on the flexible substrate (FS) caused by generation of bubbles on the first organic layer (OL1) or the second organic layer (OL2) by the foreign particles (PA) or generation of cracks on the first inorganic layer (CL1). The generation of defects on the flexible substrate (FS) is controlled to prevent permeation of external moisture into the organic light emitting diode (OLED) caused by the defects generated on the flexible substrate (FS) and improve the life-span of the flexible display device.

That is, the method for manufacturing a flexible display device with improved life-span according to the fifth exemplary embodiment of the present invention is provided.

Figure 16:
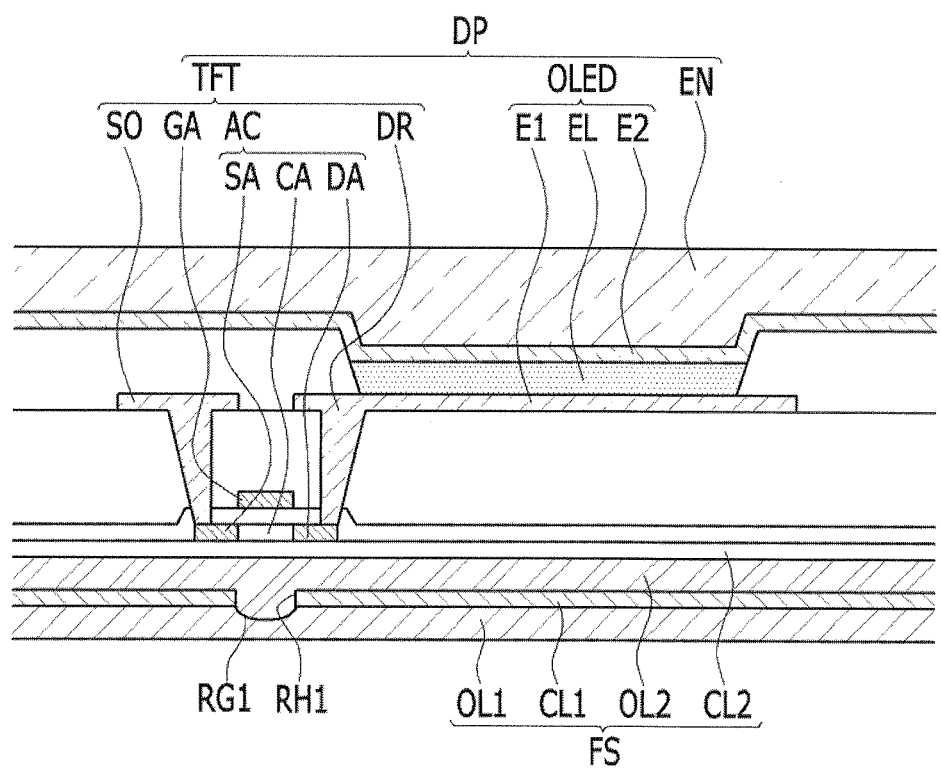
FIG. 16 shows a flexible display device according to a sixth exemplary embodiment of the present invention.

Referring to FIG. 16, a flexible display device according to a sixth exemplary embodiment of the present invention will now be described. The flexible display device according to the sixth exemplary embodiment of the present invention can be manufactured by using the method for manufacturing a flexible display device according to the fifth exemplary embodiment of the present invention.

Parts that are different from the second exemplary embodiment will be described, and parts that are omitted follow the second exemplary embodiment. For better comprehension and ease of description, the same constituent elements as the second exemplary embodiment of the present invention will use the same reference numerals in the sixth exemplary embodiment of the present invention.

FIG. 16 shows a flexible display device according to a sixth exemplary embodiment of the present invention.

As shown in FIG. 16, the flexible display device 1006 according to the sixth exemplary embodiment of the present invention is flexible, and it includes a flexible substrate (FS) and a display (DP).

The flexible substrate (FS) includes a first organic layer (OL1), a first inorganic layer (CL1), a second organic layer (OL2), and a second inorganic layer (CL2).

The first organic layer (OL1) can be a single layer or multilayers including at least one of polyethylene terephthalate, polyimide, polycarbonate, epoxy, polyethylene, and polyacrylate, and it has a recessed first repair groove (RG1).

The first inorganic layer (CL1) is provided on the first organic layer (OL1), and may be a single layer or multilayers including at least one of SiNx, $Al_2O_3$, $SiO_2$, and $TiO_2$ which are inorganic materials. The first inorganic layer (CL1) is thinner than the first organic layer (OL1), and it includes a penetrated first repair hole (RH1) for exposing the first repair groove (RG1).

The second organic layer (OL2) may be provided on the first inorganic layer (CL1), and it can be a single layer or multilayers including at least one of polyethylene terephthalate, polyimide, polycarbonate, epoxy, polyethylene, and polyacrylate. The second organic layer (OL2) may be thicker than the first inorganic layer (CL1), and a part of the second organic layer (OL2) may be provided inside the first repair groove (RG1) through the first repair hole (RH1) to fill the first repair hole (RH1) and the first repair groove (RG1).

The second inorganic layer (CL2) may be provided on the second organic layer (OL2), and may be a single layer or multilayers including at least one of SiNx, $Al_2O_3$, $SiO_2$, and $TiO_2$ which are inorganic materials. The second inorganic layer (CL2) may be flat on the second organic layer (OL2).

As described, when the first inorganic layer (CL1) included in the initial flexible substrate (FS) may be formed and the foreign particles (PA) are included in the first inorganic layer (CL1), the flexible display device 1006 according to the sixth exemplary embodiment of the present invention removes the foreign particles (PA) from the first inorganic layer (CL1) by using the laser beams (LA), and the first inorganic layer (CL1) and the first organic layer (OL1) include the first repair hole (RH1) and the first repair groove (RG1) thereby preventing generation of defects on the flexible substrate (FS) caused by generation of bubbles on the first organic layer (OL1) or the second organic layer (OL2) by the foreign particles (PA) or generation of cracks on the first inorganic layer (CL1). The generation of defects on the flexible substrate (FS) may be controlled to prevent permeation of external moisture into the organic light emitting diode (OLED) caused by the defects generated on the flexible substrate (FS) and improve the life-span of the flexible display device 1006.

That is, when the foreign particles (PA) are provided on the first inorganic layer (CL1) of the initial flexible substrate (FS), the flexible display device 1006 from which the foreign particles (PA) are removed and of which the life-span is improved according to the sixth exemplary embodiment of the present invention is provided.

Figure 17:
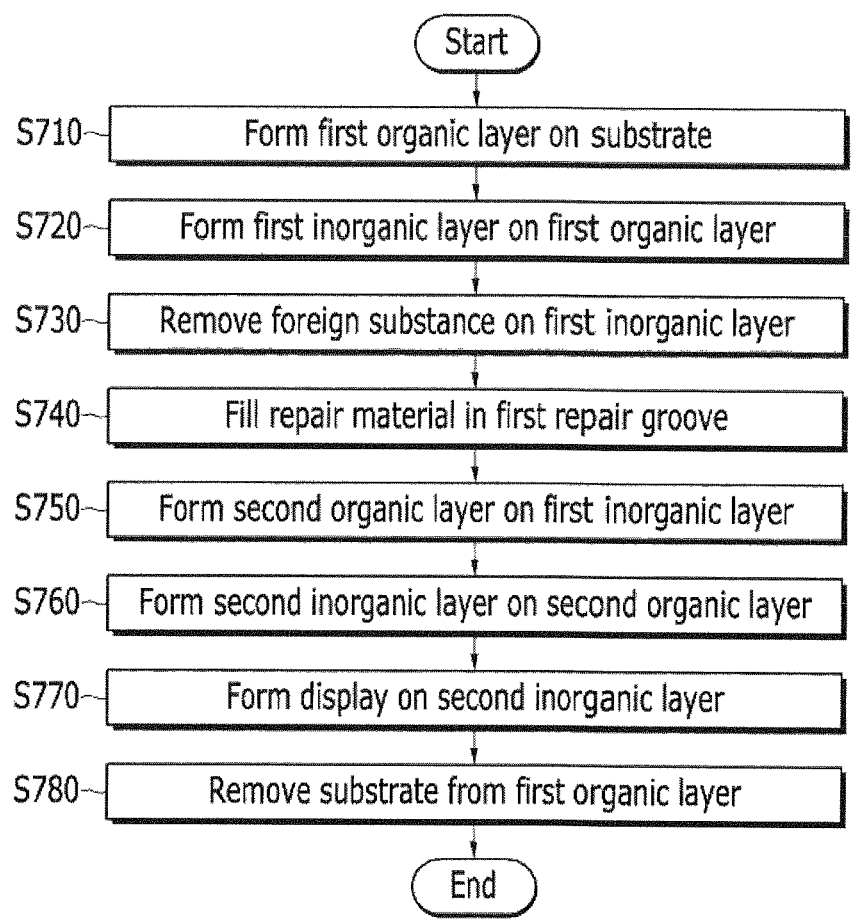
FIG. 17 shows a flowchart of a method for manufacturing a flexible display device according to a seventh exemplary embodiment of the present invention.
Figure 18:
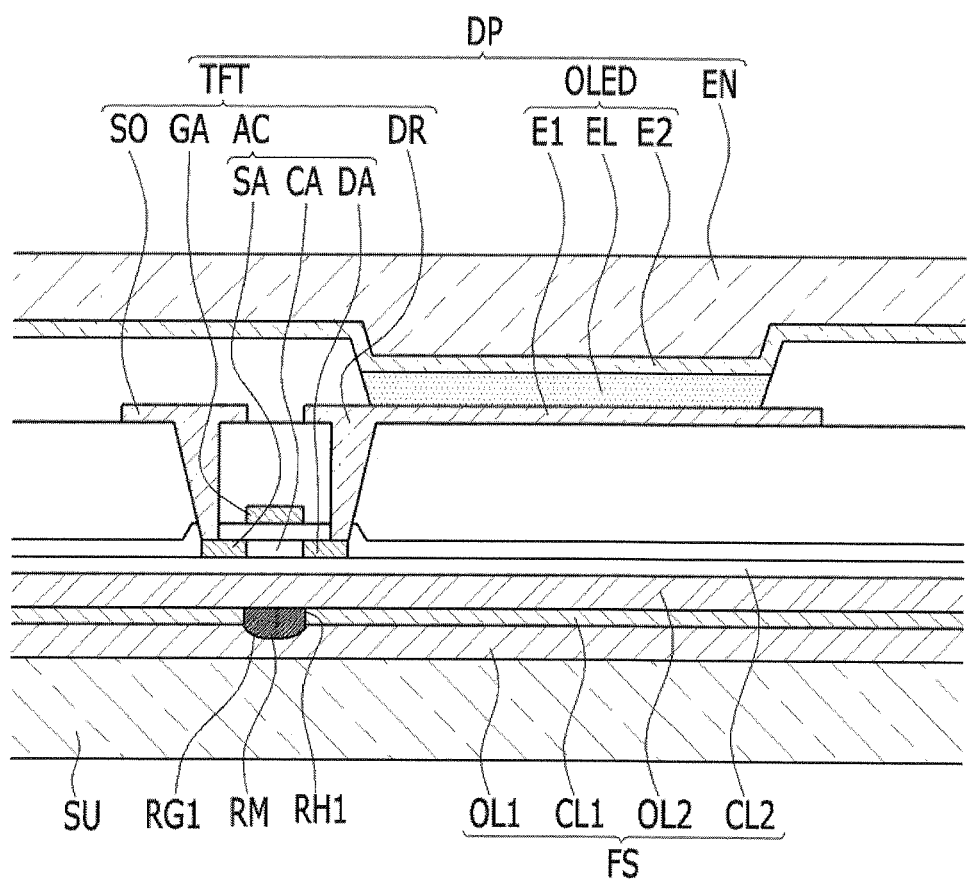
FIG. 18 shows a method for manufacturing a flexible display device according to a seventh exemplary embodiment of the present invention.

Referring to FIG. 17 and FIG. 18, a method for manufacturing a flexible display device according to a seventh exemplary embodiment of the present invention will now be described.

Parts that are different from the fifth exemplary embodiment will be described, and parts that are omitted follow the fifth exemplary embodiment. For better comprehension and ease of description, the same constituent elements as the fifth exemplary embodiment of the present invention will use the same reference numerals in the seventh exemplary embodiment of the present invention.

FIG. 17 shows a flowchart of a method for manufacturing a flexible display device according to a seventh exemplary embodiment of the present invention. FIG. 18 shows a method for manufacturing a flexible display device according to a seventh exemplary embodiment of the present invention.

As shown in FIG. 17 and FIG. 18, a first organic layer (OL1) may be formed on a substrate (SU) (S710).

A first inorganic layer (CL1) may be formed on the first organic layer (OL1) (S720).

The foreign particles (PA) provided on the first inorganic layer (CL1) are removed to form a recessed first repair groove (RG1) in the first organic layer (OL1) and a first repair hole (RH1) for exposing the first repair groove (RG1) in the first inorganic layer (CL1) (S730).

The first repair groove (RG1) and the first repair hole (RH1) are filled with a repair material (RM) (S740).

In detail, the recessed first repair groove (RG1) may be filled with the repair material (RM) including a metal, an organic material, or an inorganic material through the opened first repair hole (RH1) by using the coating process or the deposition process. Therefore, the second organic layer (OL2) and the second inorganic layer (CL2) will be formed to be flat on the repair material (RM) afterwards.

A second organic layer (OL2) may be formed on the first inorganic layer (CL1) (S750).

A second inorganic layer (CL2) may be formed on the second organic layer (OL2) (S760).

The flexible substrate (FS) may be formed according to the above-noted method.

A display (DP) may be formed on the second inorganic layer (CL2) (S770).

As described above, a plurality of the display (DP) can be formed on the substrate (SU). The plurality of the display (DP) can be divided into an individual display (DP) by a process for cutting the substrate. As a result, a display panel can include the individual display (DP) disposed on the cut-substrate.

The substrate (SU) may be removed from the first organic layer (OL1) (S780).

According to the above-described process, a flexible display device according to an eighth exemplary embodiment of the present invention to be described is manufactured.

As described, when the first inorganic layer (CL1) included in the initial flexible substrate (FS) is formed and the foreign particles (PA) are included in the first inorganic layer (CL1), the method for manufacturing a flexible display device according to the seventh exemplary embodiment of the present invention removes the foreign particles (PA) from the first inorganic layer (CL1) by using the laser beams (LA) and fills the repair material (RM) in the first repair hole (RH1) and the first repair groove (RG1) that are formed in the removed part, thereby preventing generation of defects on the flexible substrate (FS) caused by generation of bubbles on the first organic layer (OL1) or the second organic layer (OL2) by the foreign particles (PA) or generation of cracks on the first inorganic layer (CL1). The generation of defects on the flexible substrate (FS) is controlled to prevent permeation of external moisture into the organic light emitting diode (OLED) caused by the defects generated on the flexible substrate (FS) and improve the life-span of the flexible display device.

That is, the method for manufacturing a flexible display device with improved life-span according to the seventh exemplary embodiment of the present invention is provided.

Figure 19:
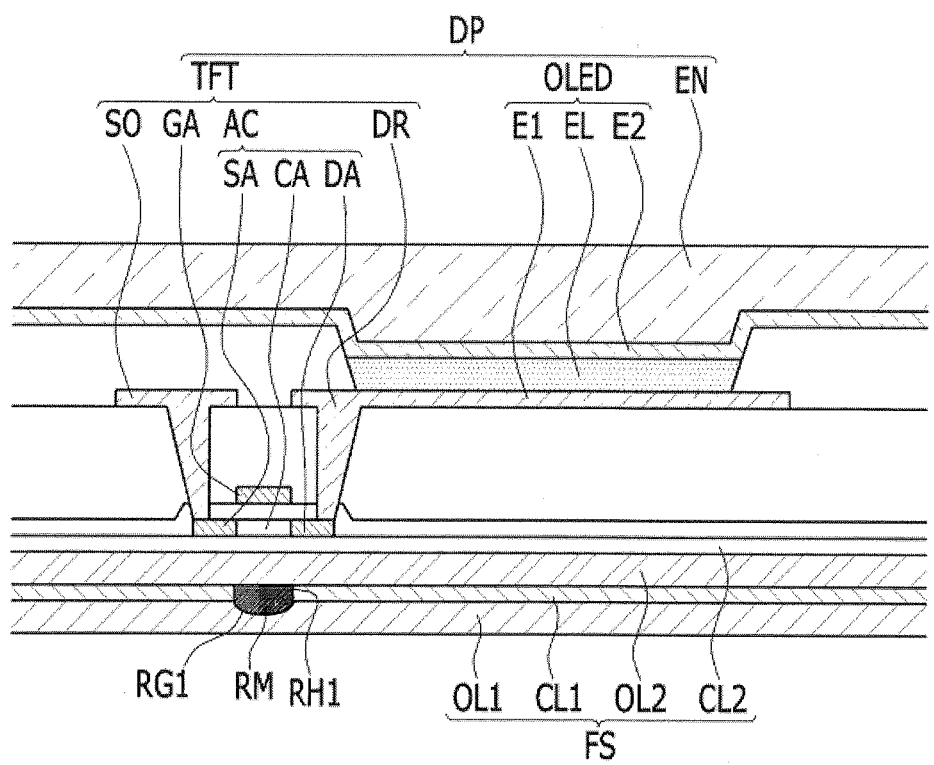
FIG. 19 shows a flexible display device according to an eighth exemplary embodiment of the present invention.

Referring to FIG. 19, a flexible display device according to an eighth exemplary embodiment of the present invention will now be described. The flexible display device according to the eighth exemplary embodiment of the present invention can be manufactured by using the method for manufacturing a flexible display device according to the seventh exemplary embodiment of the present invention.

Parts that are different from the sixth exemplary embodiment will be described, and parts that are omitted follow the sixth exemplary embodiment. For better comprehension and ease of description, the same constituent elements as the sixth exemplary embodiment of the present invention will use the same reference numerals in the eighth exemplary embodiment of the present invention.

FIG. 19 shows a flexible display device according to an eighth exemplary embodiment of the present invention.

As shown in FIG. 19, the flexible display device 1008 according to the eighth exemplary embodiment of the present invention is flexible and it includes a flexible substrate (FS) and a display (DP).

The flexible substrate (FS) includes a first organic layer (OL1), a first inorganic layer (CL1), a second organic layer (OL2), a second inorganic layer (CL2), and a repair material (RM).

The repair material (RM) fills the first repair groove (RG1) formed in the first organic layer (OL1) and the first repair hole (RH1) formed in the first inorganic layer (CL1), and it includes a metal, an organic material, or an inorganic material. Therefore, the second organic layer (OL2) and the second inorganic layer (CL2) provided on the repair material (RM) are flat.

As described, when the first inorganic layer (CL1) included in the initial flexible substrate (FS) may be formed and the foreign particles (PA) are included in the first inorganic layer (CL1), the flexible display device 1008 according to the eighth exemplary embodiment of the present invention removes the foreign particles (PA) from the first inorganic layer (CL1) by using the laser beams (LA), the first inorganic layer (CL1) and the first organic layer (OL1) includes the first repair hole (RH1) and the first repair groove (RG1), and the first repair hole (RH1) and the first repair hole (RH1) are filled with the repair material (RM), thereby preventing generation of defects on the flexible substrate (FS) caused by generation of bubbles on the first organic layer (OL1) or the second organic layer (OL2) by the foreign particles (PA) or generation of cracks on the first inorganic layer (CL1). The generation of defects on the flexible substrate (FS) is controlled to prevent permeation of external moisture into the organic light emitting diode (OLED) caused by the defects generated on the flexible substrate (FS) and improve the life-span of the flexible display device 1008.

That is, when the foreign particles (PA) are provided on the first inorganic layer (CL1) of the initial flexible substrate (FS), the flexible display device 1008 from which the foreign particles (PA) are removed and of which the life-span is improved according to the eighth exemplary embodiment of the present invention is provided.

Referring to FIG. 20 to FIG. 24, a method for manufacturing a flexible display device according to a ninth exemplary embodiment of the present invention will now be described.

Parts that are different from the first exemplary embodiment will be described, and parts that are omitted follow the first exemplary embodiment. For better comprehension and ease of description, the same constituent elements as the first exemplary embodiment of the present invention will use the same reference numerals in the ninth exemplary embodiment of the present invention.

Figure 20:
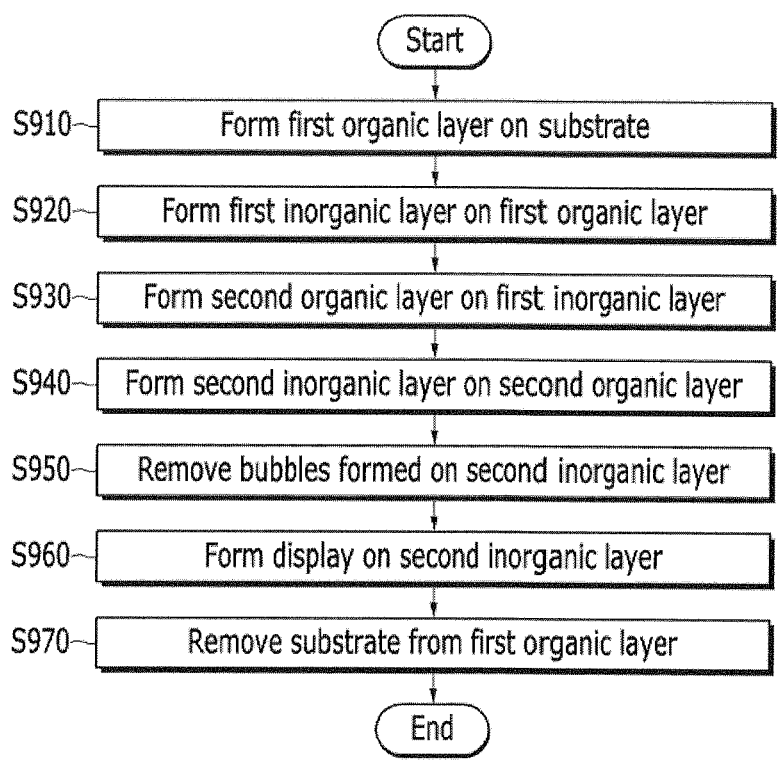
FIG. 20 shows a flowchart of a method for manufacturing a flexible display device according to a ninth exemplary embodiment of the present invention.

FIG. 20 shows a flowchart of a method for manufacturing a flexible display device according to a ninth exemplary embodiment of the present invention. FIG. 21 to FIG. 24 show a method for manufacturing a flexible display device according to a ninth exemplary embodiment of the present invention.

Figure 21:
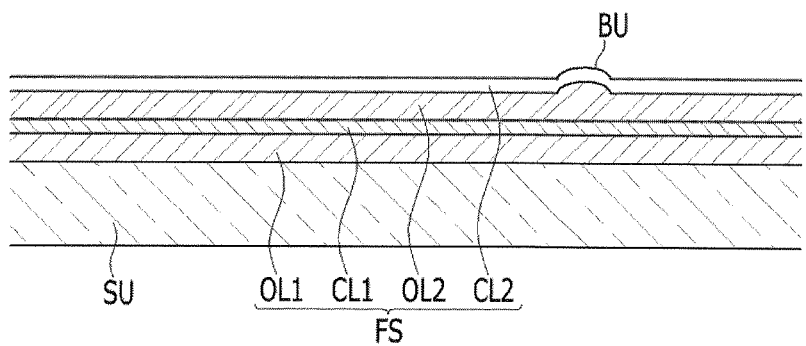
FIG. 21 to FIG. 24 show a method for manufacturing a flexible display device according to a ninth exemplary embodiment of the present invention.

As shown in FIG. 20 and FIG. 21, a first organic layer (OL1) may be formed on a substrate (SU) (S910).

A first inorganic layer (CL1) may be formed on the first organic layer (OL1) (S920).

A second organic layer (OL2) may be formed on the first inorganic layer (CL1) (S930).

A second inorganic layer (CL2) may be formed on the second organic layer (OL2) (S940).

When undesired foreign particles are provided on at least one of the second organic layer (OL2) and the second inorganic layer (CL2) during the above-noted process, bubbles (BU) may be generated on the second organic layer (OL2) and the second inorganic layer (CL2) by the heat generated during the deposition process for forming the second inorganic layer (CL2) or the hardening process for hardening the second organic layer (OL2).

Figure 22:
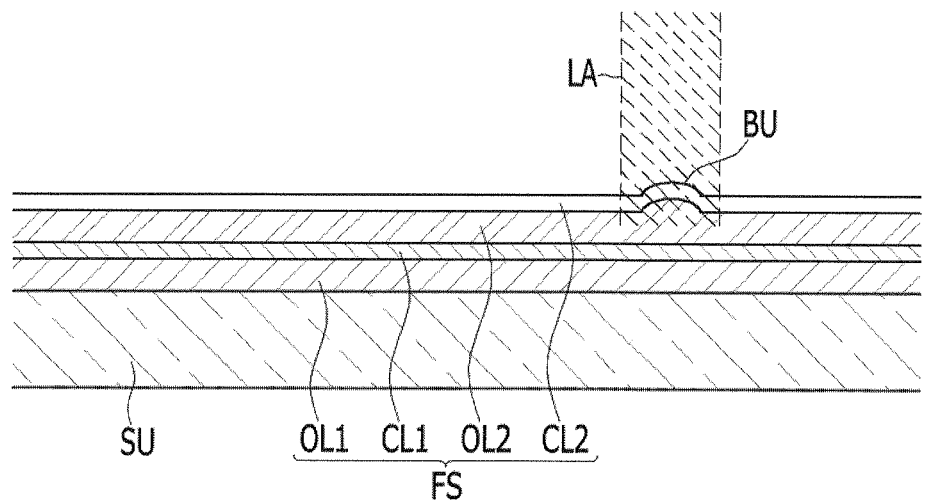
Figure 23:
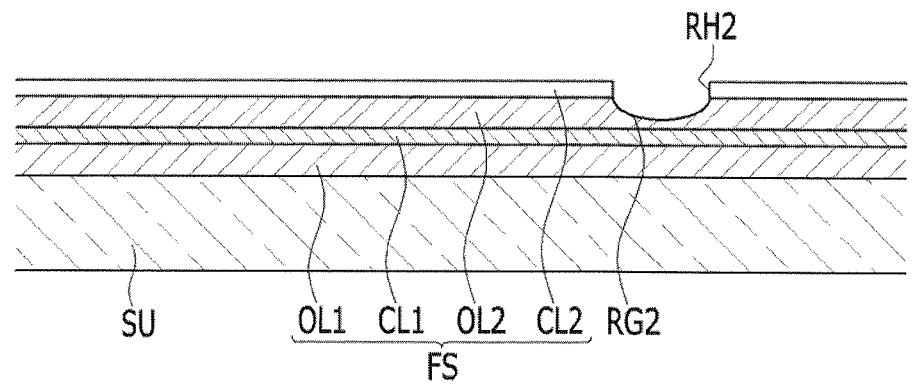

As shown in FIG. 22 and FIG. 23, the bubbles (BU) formed on the second inorganic layer (CL2) are removed to form a recessed second repair groove (RG2) in the second organic layer (OL2) and a second repair hole (RH2) for exposing the second repair groove (RG2) on the second inorganic layer (CL2) (S950).

In detail, it is tested whether bubbles (BU) are formed on the second inorganic layer (CL2) by using a bubble testing device including a CCD, and when the undesired bubbles (BU) are formed on the second inorganic layer (CL2), laser beams (LA) are irradiated to a part of the second inorganic layer (CL2) on which the bubbles (BU) are provided to thereby remove the bubbles (BU) from the second inorganic layer (CL2). Therefore, a second repair hole (RH2) may be formed in the part of the second inorganic layer (CL2), and a recessed second repair groove (RG2) may be formed in the second organic layer (OL2) corresponding to the second repair hole (RH2).

The flexible substrate (FS) may be formed according to the above-noted method.

Figure 24:
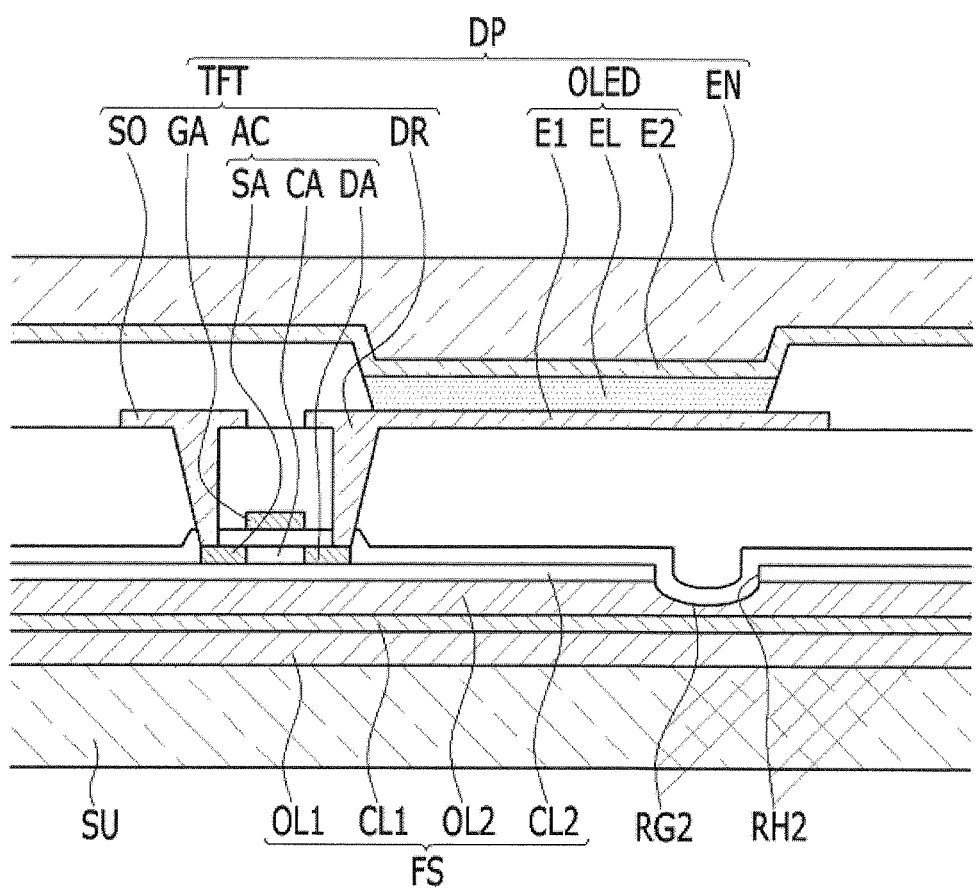

As shown in FIG. 24, a display (DP) may be formed on the second inorganic layer (CL2) (S960).

A part that is provided corresponding to the second repair hole (RH2) and the second repair groove (RG2) in the display (DP) may be provided inside the second repair groove (RG2) or not.

For example, when the second repair hole (RH2) and the second repair groove (RG2) are provided corresponding to an active layer (AC), the active layer (AC) may be provided inside the second repair groove (RG2), and when the second repair hole (RH2) and the second repair groove (RG2) are provided corresponding to the first electrode (E1), the active layer (AC) is not provided inside the second repair groove (RG2).

A substrate (SU) may be removed from the first organic layer (OL1) (S970).

A flexible display device according to a tenth exemplary embodiment of the present invention to be described is manufactured according to the above-noted process.

As described, the method for manufacturing a flexible display device according to the ninth exemplary embodiment of the present invention removes the bubbles (BU) from the second inorganic layer (CL2) by using the laser beams (LA) when the bubbles (BU) are formed on the initial flexible substrate (FS) because of foreign particles, thereby preventing generation of defects on the flexible substrate (FS). The generation of defects on the flexible substrate (FS) is controlled to prevent permeation of external moisture into the organic light emitting diode (OLED) caused by the defects generated on the flexible substrate (FS) and improve the life-span of the flexible display device.

That is, the method for manufacturing a flexible display device with improved life-span according to the ninth exemplary embodiment of the present invention is provided.

Figure 25:
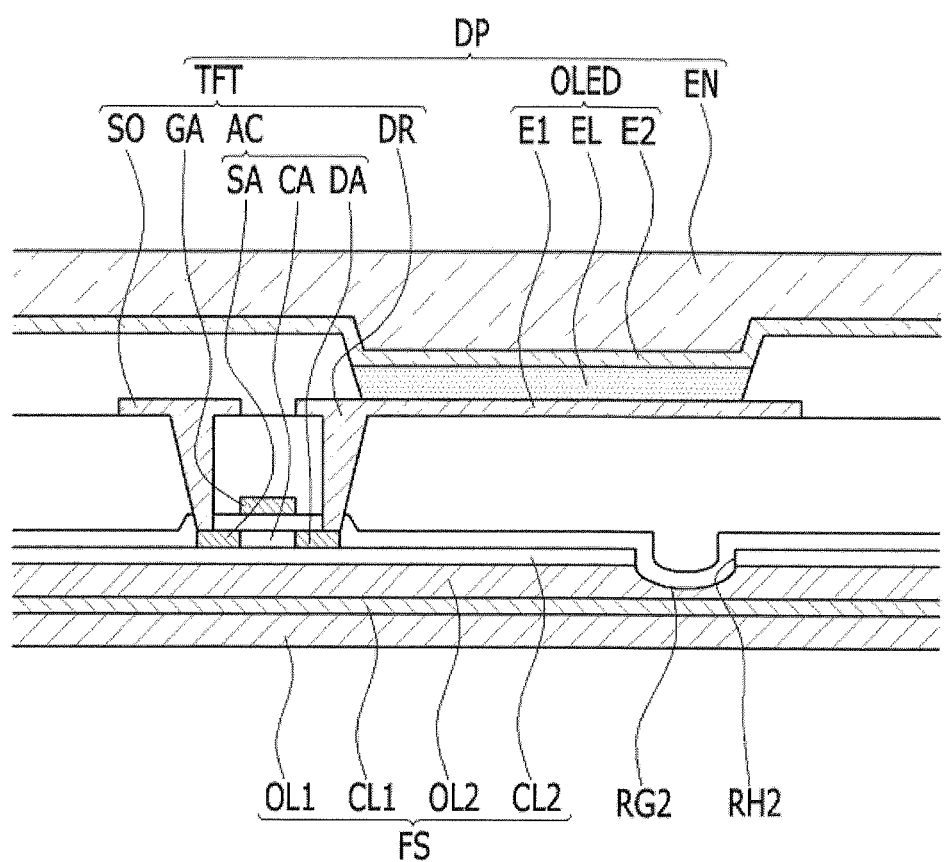
FIG. 25 shows a flexible display device according to a tenth exemplary embodiment of the present invention.

Referring to FIG. 25, a flexible display device according to a tenth exemplary embodiment of the present invention will now be described. The flexible display device according to the tenth exemplary embodiment of the present invention can be manufactured by using the method for manufacturing a flexible display device according to the ninth exemplary embodiment of the present invention.

Parts that are different from the second exemplary embodiment will be described, and parts that are omitted follow the second exemplary embodiment. For better comprehension and ease of description, the same constituent elements as the second exemplary embodiment of the present invention will use the same reference numerals in the tenth exemplary embodiment of the present invention.

FIG. 25 shows a flexible display device according to a tenth exemplary embodiment of the present invention.

As shown in FIG. 25, the flexible display device 1010 according to the tenth exemplary embodiment of the present invention is flexible, and it includes a flexible substrate (FS) and a display (DP).

The flexible substrate (FS) includes a first organic layer (OL1), a first inorganic layer (CL1), a second organic layer (OL2), and a second inorganic layer (CL2).

The second organic layer (OL2) and the second inorganic layer (CL2) include a second repair groove (RG2) and a second repair hole (RH2), respectively.

As described, when the bubbles (BU) are formed on the flexible substrate (FS) because of foreign particles, the flexible display device 1010 according to the tenth exemplary embodiment of the present invention removes the bubbles (BU) from the second inorganic layer (CL2) by using the laser beams (LA) so that the second organic layer (OL2) and the second inorganic layer (CL2) include the second repair groove (RG2) and the second repair hole (RH2), respectively, thereby preventing generation of cracks on the second inorganic layer (CL2) by the bubbles (BU) and subsequent generation of defects on the flexible substrate (FS). The generation of defects on the flexible substrate (FS) is controlled to prevent permeation of external moisture into the organic light emitting diode (OLED) caused by the defects generated on the flexible substrate (FS) and improve the life-span of the flexible display device 1010.

That is, the flexible display device 1010 from which the bubbles (BU) are removed and of which the life-span is improved when the bubbles (BU) are formed on the second inorganic layer (CL2) of the flexible substrate (FS) according to the tenth exemplary embodiment of the present invention is provided.

Figure 26:
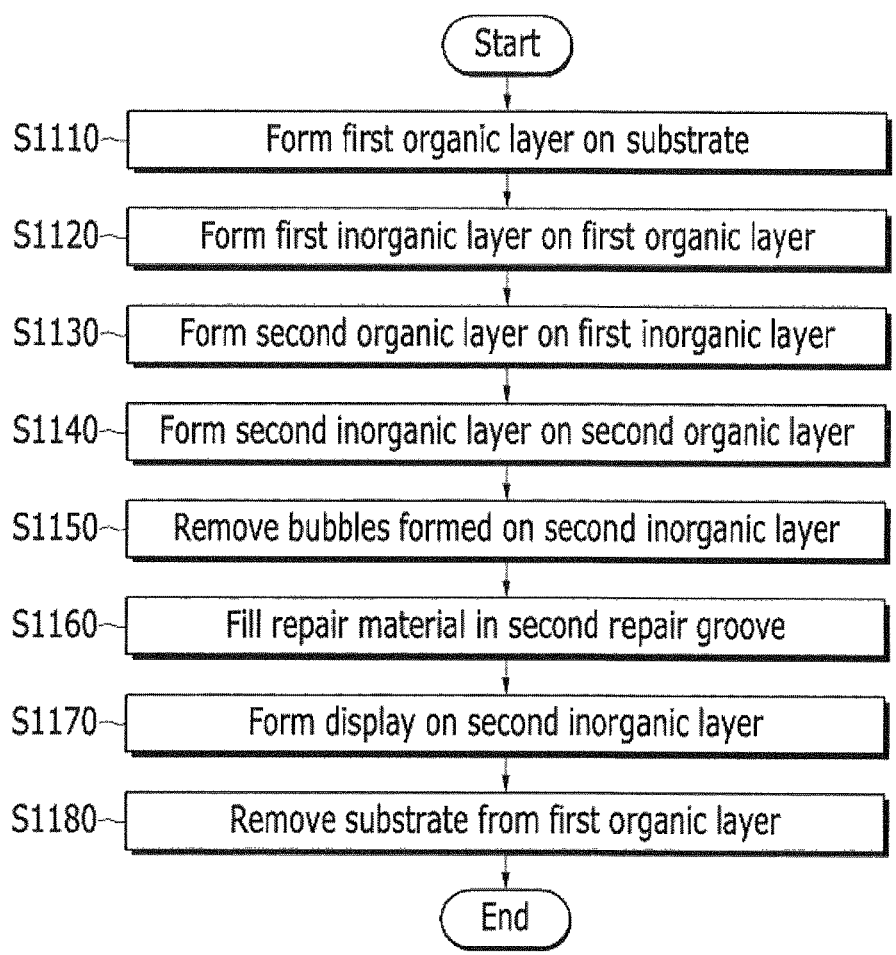
FIG. 26 shows a flowchart of a method for manufacturing a flexible display device according to an eleventh exemplary embodiment of the present invention.
Figure 27:
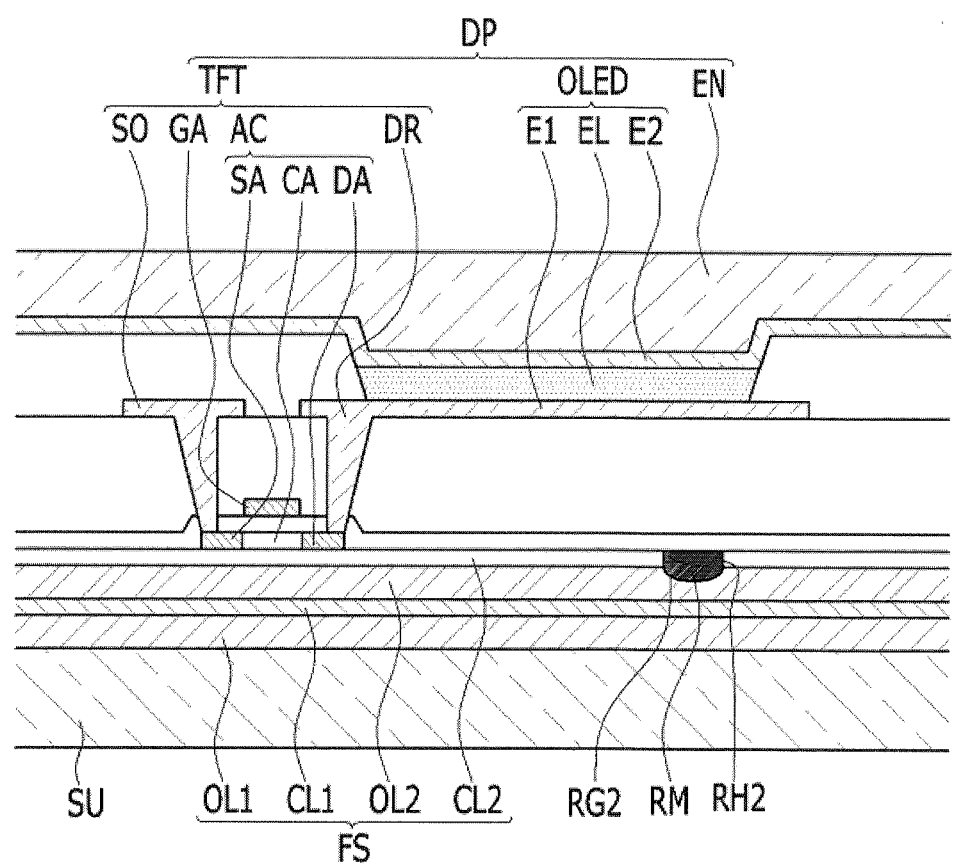
FIG. 27 shows a method for manufacturing a flexible display device according to an eleventh exemplary embodiment of the present invention.

Referring to FIG. 26 and FIG. 27, a method for manufacturing a flexible display device according to an eleventh exemplary embodiment of the present invention will now be described Parts that are different from the ninth exemplary embodiment will be described, and parts that are omitted follow the ninth exemplary embodiment. For better comprehension and ease of description, the same constituent elements as the ninth exemplary embodiment of the present invention will use the same reference numerals in the eleventh exemplary embodiment of the present invention.

FIG. 26 shows a flowchart of a method for manufacturing a flexible display device according to an eleventh exemplary embodiment of the present invention. FIG. 27 shows a method for manufacturing a flexible display device according to an eleventh exemplary embodiment of the present invention.

As shown in FIG. 26 and FIG. 27, a first organic layer (OL1) may be formed on a substrate (SU) (S1110).

A first inorganic layer (CL1) may be formed on the first organic layer (OL1) (S1120).

A second organic layer (OL2) may be formed on the first inorganic layer (CL1) (S1130).

A second inorganic layer (CL2) may be formed on the second organic layer (OL2) (S1140).

When undesired foreign particles are provided on at least one of the second organic layer (OL2) and the second inorganic layer (CL2) during the process, bubbles (BU) are generated on the second organic layer (OL2) and the second inorganic layer (CL2) by the heat generated by the deposition process for forming the second inorganic layer (CL2) or the hardening process for hardening the second organic layer (OL2).

The bubbles (BU) formed on the second inorganic layer (CL2) are removed to form a recessed second repair groove (RG2) in the second organic layer (OL2) and a second repair hole (RH2) for exposing the second repair groove (RG2) on the second inorganic layer (CL2) (S1150).

In detail, it is tested whether bubbles (BU) are formed on the second inorganic layer (CL2) by using a bubble testing device including a CCD, and when the undesired bubbles (BU) are formed on the second inorganic layer (CL2), laser beams (LA) are irradiated to a part of the second inorganic layer (CL2) on which the bubbles (BU) are provided to thereby remove the bubbles (BU) from the second inorganic layer (CL2). Therefore, a second repair hole (RH2) may be formed in the part of the second inorganic layer (CL2), and a recessed second repair groove (RG2) may be formed in the second organic layer (OL2) corresponding to the second repair hole (RH2).

A repair material (RM) may be filled in the second repair groove (RG2) (S1160).

In detail, the repair material (RM) including a metal, an organic material, or an inorganic material may be filled in the recessed second repair groove (RG2) by using the coating process or the deposition process. Therefore, the display (DP) formed on the repair material (RM) may be formed to be flat.

The flexible substrate (FS) is formed according to the above-noted method.

A display (DP) may be formed on the second inorganic layer (CL2) (S1170).

As described above, a plurality of the display (DP) can be formed on the substrate (SU). The plurality of the display (DP) can be divided into an individual display (DP) by a process for cutting the substrate. As a result, a display panel can include the individual display (DP) disposed on the cut-substrate.

The substrate (SU) may be removed from the first organic layer (OL1) (S1180).

A flexible display device according to a twelfth exemplary embodiment of the present invention to be described is manufactured according to the above-noted process.

As described, when bubbles (BU) are formed on the initial flexible substrate (FS) by foreign particles, the method for manufacturing a flexible display device according to the eleventh exemplary embodiment of the present invention removes the bubbles (BU) from the second inorganic layer (CL2) by using laser beams (LA), and fills the removed part with the repair material (RM), thereby preventing generation of defects on the flexible substrate (FS). The generation of defects on the flexible substrate (FS) is controlled to prevent permeation of external moisture into the organic light emitting diode (OLED) caused by the defects generated on the flexible substrate (FS) and improve the life-span of the flexible display device.

That is, the method for manufacturing a flexible display device with improved life-span according to the tenth exemplary embodiment of the present invention is provided.

Figure 28:
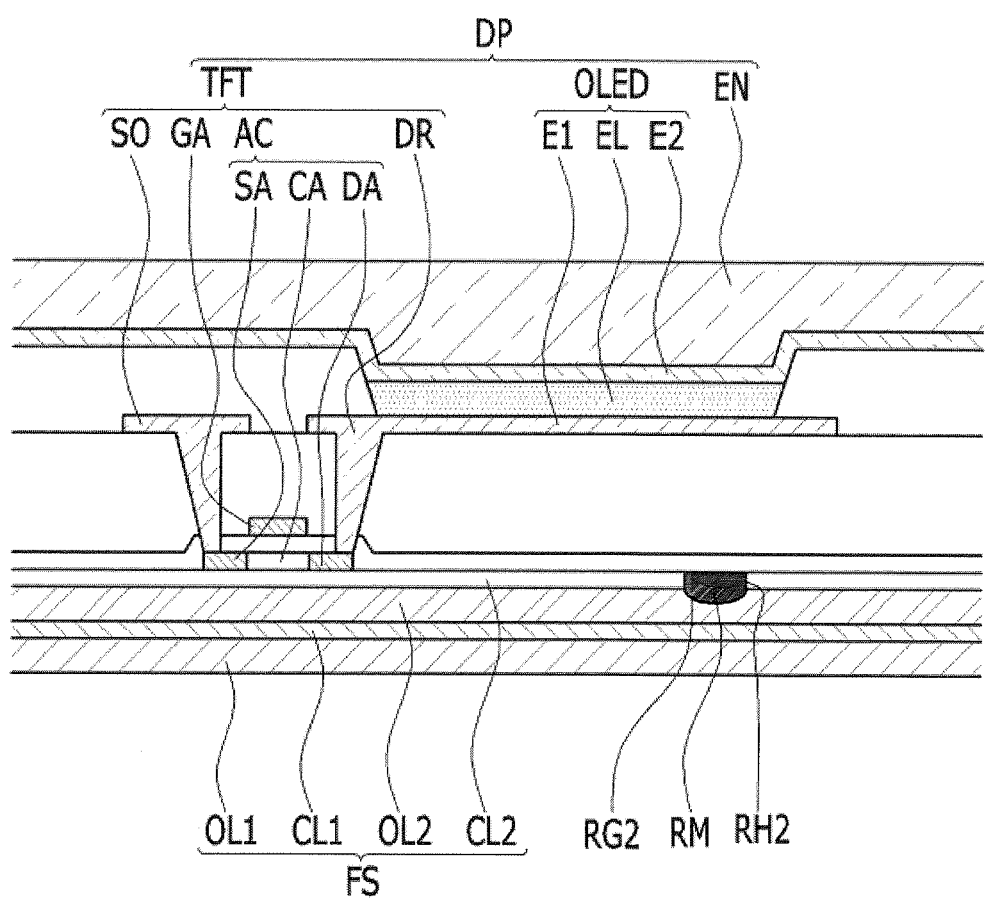
FIG. 28 shows a flexible display device according to a twelfth exemplary embodiment of the present invention.

Referring to FIG. 28, a flexible display device according to a twelfth exemplary embodiment of the present invention will now be described. The flexible display device according to the twelfth exemplary embodiment of the present invention can be manufactured by using the method for manufacturing a flexible display device according to the eleventh exemplary embodiment of the present invention.

Parts that are different from the tenth exemplary embodiment will be described, and parts that are omitted follow the tenth exemplary embodiment. For better comprehension and ease of description, the same constituent elements as the tenth exemplary embodiment of the present invention will use the same reference numerals in the twelfth exemplary embodiment of the present invention.

FIG. 28 shows a flexible display device according to a twelfth exemplary embodiment of the present invention.

As shown in FIG. 28, the flexible display device 1012 according to the twelfth exemplary embodiment of the present invention is flexible, and it includes a flexible substrate (FS) and a display (DP).

The flexible substrate (FS) includes a first organic layer (OL1), a first inorganic layer (CL1), a second organic layer (OL2), a second inorganic layer (CL2), and a repair material (RM).

The second organic layer (OL2) and the second inorganic layer (CL2) respectively include a second repair groove (RG2) and a second repair hole (RH2).

A repair material (RM) fills the second repair groove (RG2) through the second repair hole (RH2).

The display (DP) is provided in the second repair groove (RG2) and may be formed to be flat.

As described, when bubbles (BU) are formed on the flexible substrate (FS) by the foreign particles, the flexible display device 1012 according to the twelfth exemplary embodiment of the present invention removes the bubbles (BU) from the second inorganic layer (CL2) by using laser beams (LA) so the second organic layer (OL2) and the second inorganic layer (CL2) respectively include a second repair groove (RG2) and a second repair hole (RH2), and the second repair groove (RG2) may be filled with the repair material (RM) thereby preventing generation of cracks on the second inorganic layer (CL2) by the bubbles (BU) and generation of defects on the flexible substrate (FS). The generation of defects on the flexible substrate (FS) is controlled to prevent permeation of external moisture into the organic light emitting diode (OLED) caused by the defects generated on the flexible substrate (FS) and improve the life-span of the flexible display device 1012.

That is, when the bubbles (BU) are formed on the second inorganic layer (CL2) of the flexible substrate (FS), the flexible display device 1012 from which the bubbles (BU) are removed and of which the life-span is improved according to the twelfth exemplary embodiment of the present invention is provided.

Referring to FIG. 29 to FIG. 33, a method for manufacturing a flexible display device according to a thirteenth exemplary embodiment of the present invention will now be described.

Parts that are different from the first exemplary embodiment will be described, and parts that are omitted follow the first exemplary embodiment. For better comprehension and ease of description, the same constituent elements as the first exemplary embodiment of the present invention will use the same reference numerals in the thirteenth exemplary embodiment of the present invention.

Figure 29:
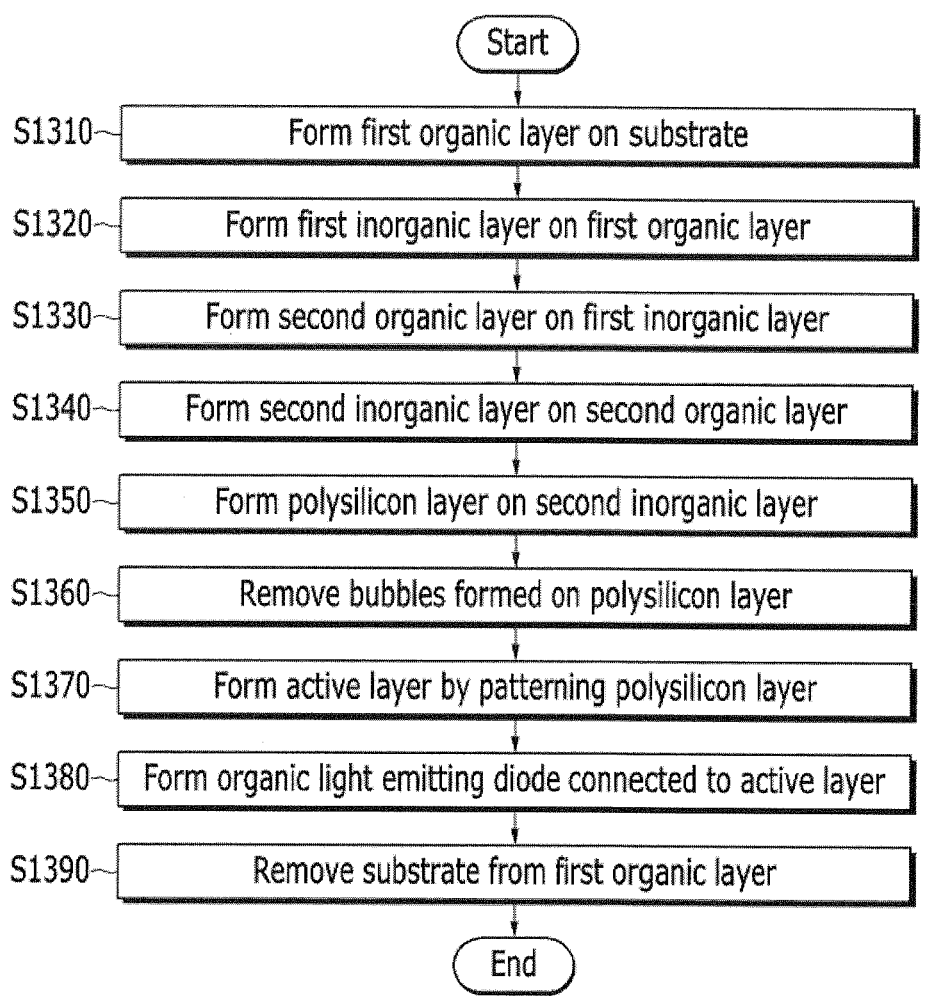
FIG. 29 shows a flowchart of a method for manufacturing a flexible display device according to a thirteenth exemplary embodiment of the present invention.

FIG. 29 shows a flowchart of a method for manufacturing a flexible display device according to a thirteenth exemplary embodiment of the present invention. FIG. 30 to FIG. 33 show a method for manufacturing a flexible display device according to a thirteenth exemplary embodiment of the present invention.

Figure 30:
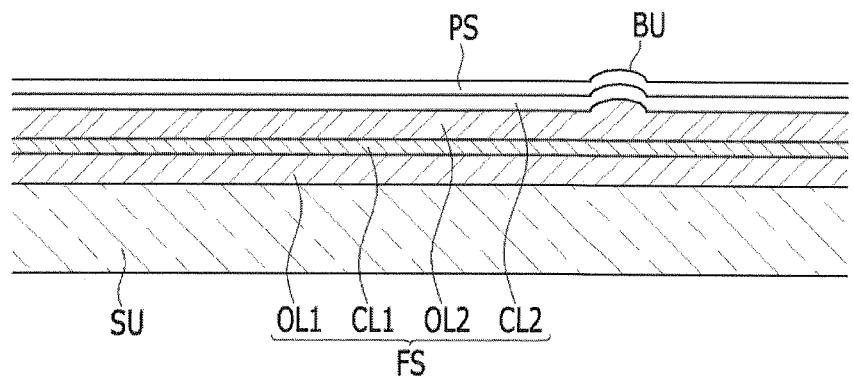
FIG. 30 to FIG. 33 show a method for manufacturing a flexible display device according to a thirteenth exemplary embodiment of the present invention.

As shown in FIG. 29 and FIG. 30, a first organic layer (OL1) may be formed on a substrate (SU) (S1310).

A first inorganic layer (CL1) may be formed on the first organic layer (OL1) (S1320).

A second organic layer (OL2) may be formed on the first inorganic layer (CL1) (S1330).

A second inorganic layer (CL2) may be formed on the second organic layer (OL2) (S1340).

The flexible substrate (FS) may be formed according to the above-noted method.

A polysilicon layer (PS) may be formed on the second inorganic layer (CL2) (S1350).

In detail, an amorphous silicon layer may be formed on the second inorganic layer (CL2), and the amorphous silicon layer may be crystallized by using heat or laser beams to form a polysilicon layer (PS) from the amorphous silicon layer.

When undesired foreign particles are provided on at least one of the second organic layer (OL2) and the second inorganic layer (CL2), bubbles (BU) are generated on the second organic layer (OL2), the second inorganic layer (CL2) and the polysilicon layer (PS) by the heat generated during the deposition process for forming the second inorganic layer (CL2), the hardening process for hardening the second organic layer (OL2), or the crystallization process for crystallizing the amorphous silicon layer.

Figure 31:
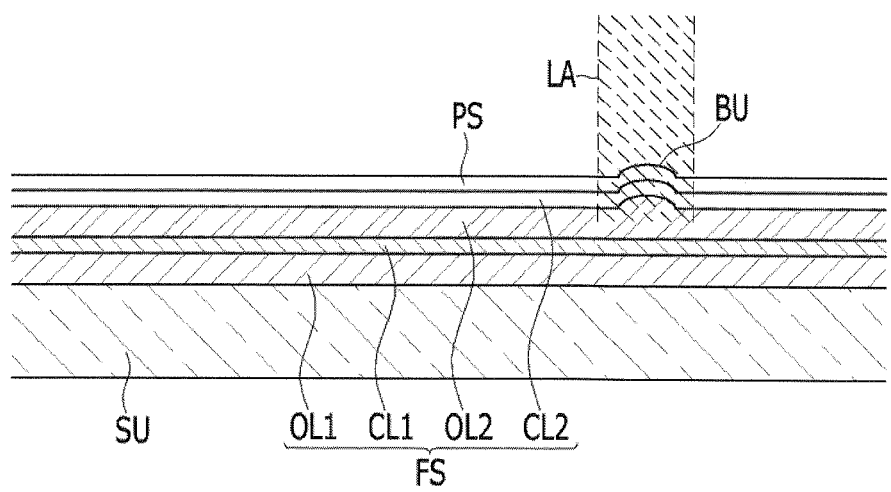
Figure 32:
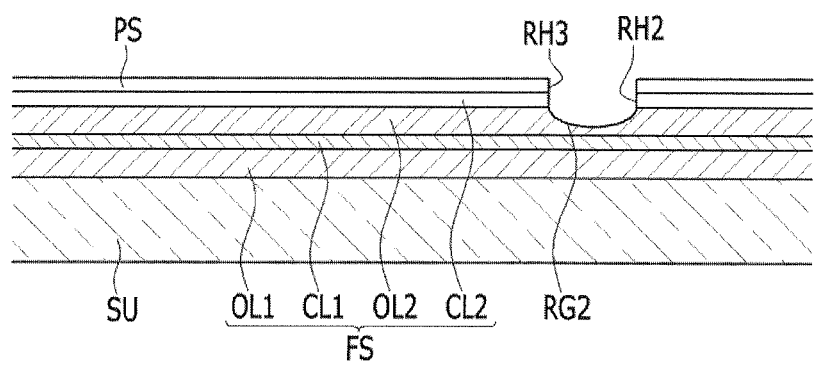

As shown in FIG. 31 and FIG. 32, the bubbles (BU) formed on the polysilicon layer (PS) are removed to form a recessed second repair groove (RG2) in the second organic layer (OL2), a second repair hole (RH2) for exposing the second repair groove (RG2) in the second inorganic layer (CL2), and a third repair hole RH3 for exposing the second repair groove (RG2) in the polysilicon layer (PS) (S1360).

In detail, it is tested by using a bubble testing device including a CCD whether bubbles (BU) are formed on the polysilicon layer (PS), and when the bubbles (BU) are found, laser beams (LA) are irradiated to a part of the polysilicon layer (PS) on which the bubbles (BU) are provided to remove the bubbles (BU) from the polysilicon layer (PS). Therefore, a third repair hole RH3 may be formed in a part of the polysilicon layer (PS) on which the bubbles (BU) were provided, a second repair hole (RH2) may be formed in a part of the second inorganic layer (CL2) corresponding to the third repair hole (RH3), and a recessed second repair groove (RG2) may be formed in the second organic layer (OL2) corresponding to the second repair hole (RH2).

Figure 33:
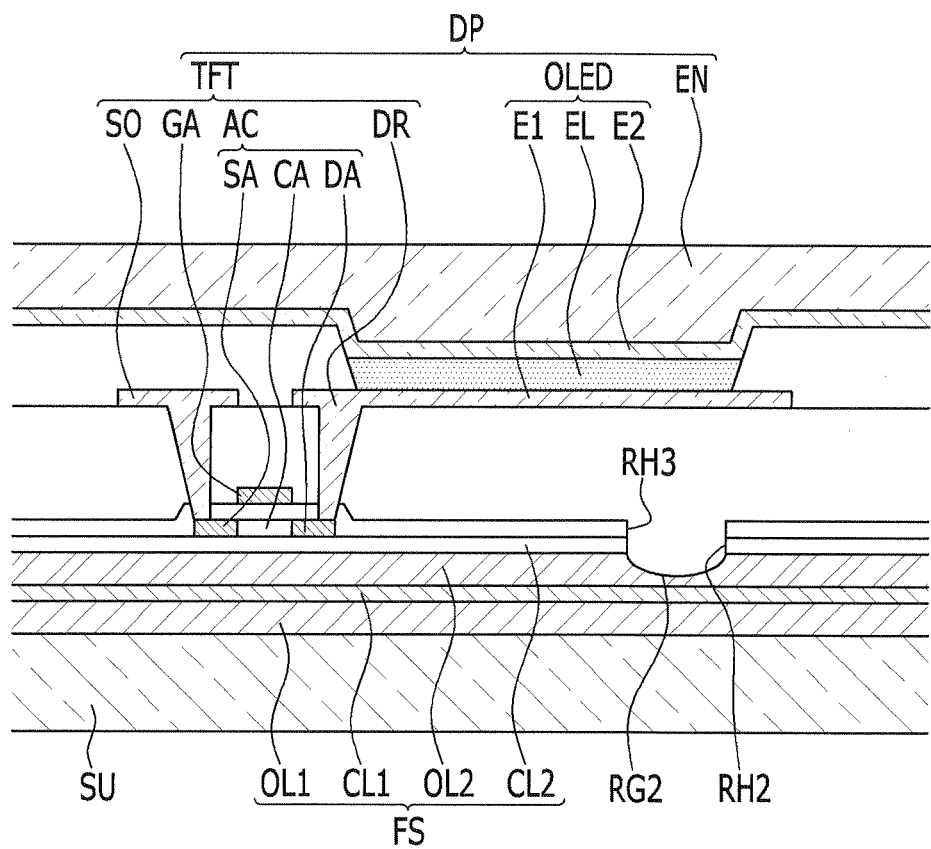

As shown in FIG. 33, an active layer (AC) may be formed by patterning the polysilicon layer (PS) (S1370).

In detail, a photolithography process may be used to pattern the polysilicon layer (PS) and form the active layer (AC), and a source electrode (SO), a drain electrode (DR), and a gate electrode (GA) are formed. In this instance, a part of the polysilicon layer (PS) in which the third repair hole RH3 may be formed is removed.

When the third repair hole RH3 may be formed on another part of the polysilicon layer (PS) to be formed as the active layer (AC), the active layer (AC) may include a third repair hole (RH3).

An organic light emitting diode (OLED) connected to the active layer (AC) may be formed (S1380).

In detail, the organic light emitting diode (OLED) may be formed by forming the first electrode E1, the organic emission layer (EL), and the second electrode E2, and a display (DP) may be formed by forming a thin-film encapsulator (EN).

The substrate (SU) may be removed from the first organic layer (OL1) (S1390).

A flexible display device according to a fourteenth exemplary embodiment of the present invention to be described is manufactured.

As described, when bubbles (BU) are formed on the initial flexible substrate (FS) by the foreign particles and the bubbles (BU) are formed on the polysilicon layer (PS) formed to be an active layer (AC), the method for manufacturing a flexible display device according to the thirteenth exemplary embodiment of the present invention removes the bubbles (BU) from the polysilicon layer (PS) by using the laser beams (LA), thereby preventing generation of undesired defects on the flexible display device. Therefore, permeation of external moisture into the organic light emitting diode (OLED) caused by the undesired defects that are generated in the flexible display device is prevented so the life-span of the flexible display device is improved.

That is, the method for manufacturing a flexible display device with improved life-span according to the thirteenth exemplary embodiment of the present invention is provided.

Figure 34:
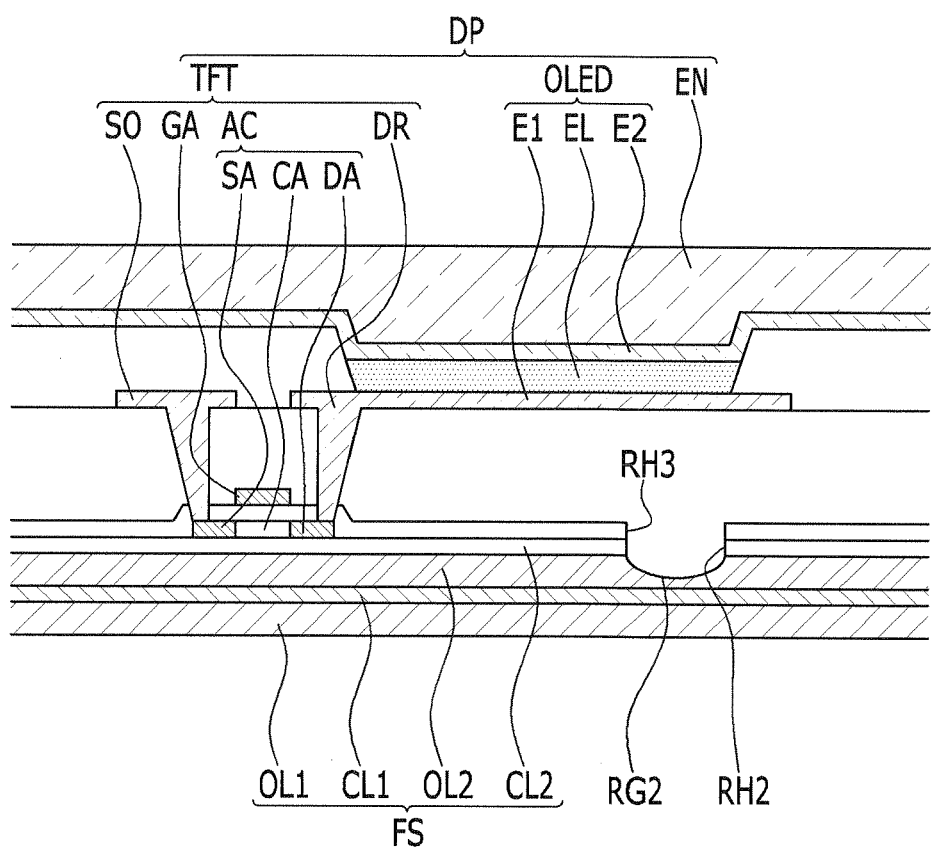
FIG. 34 shows a flexible display device according to a fourteenth exemplary embodiment of the present invention.

Referring to FIG. 34, a flexible display device according to a fourteenth exemplary embodiment of the present invention will now be described. The flexible display device according to the fourteenth exemplary embodiment of the present invention can be manufactured by using the method for manufacturing a flexible display device according to the thirteenth exemplary embodiment of the present invention.

Parts that are different from the second exemplary embodiment will be described, and parts that are omitted follow the second exemplary embodiment. For better comprehension and ease of description, the same constituent elements as the second exemplary embodiment of the present invention will use the same reference numerals in the fourteenth exemplary embodiment of the present invention.

FIG. 34 shows a flexible display device according to a fourteenth exemplary embodiment of the present invention.

As shown in FIG. 34, the flexible display device 1014 according to the fourteenth exemplary embodiment of the present invention is flexible, and it includes a flexible substrate (FS) and a display (DP).

The flexible substrate (FS) includes a first organic layer (OL1), a first inorganic layer (CL1), a second organic layer (OL2), and a second inorganic layer (CL2).

The second organic layer (OL2) and the second inorganic layer (CL2) respectively include a second repair groove (RG2) and a second repair hole (RH2).

As described, when bubbles (BU) are formed on the polysilicon layer formed to be an active layer (AC), the flexible display device 1014 according to the fourteenth exemplary embodiment of the present invention removes the bubbles (BU) from the polysilicon layer by using the laser beams (LA), and the second organic layer (OL2) and the second inorganic layer (CL2) respectively include a second repair groove (RG2) and a second repair hole (RH2) thereby preventing generation of undesired defects on the flexible display device 1014 by the bubbles (BU). Therefore, permeation of external moisture into the organic light emitting diode (OLED) caused by the undesired defects that are generated in the flexible display device 1014 is prevented so the life-span of the flexible display device 1014 is improved.

That is, according to the fourteenth exemplary embodiment of the present invention, the bubbles (BU) on the polysilicon layer are removed, so that the life-span of the flexible display device 1014 can be improved.

Figure 35:
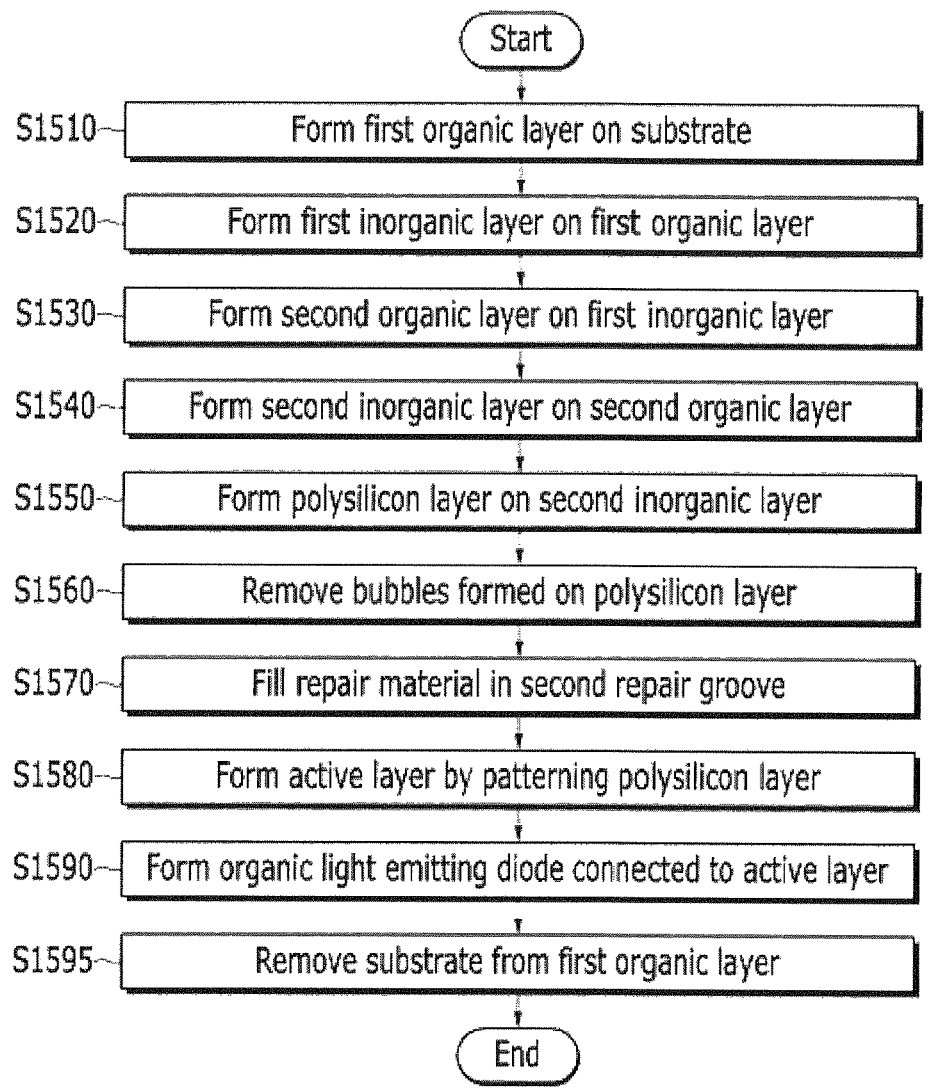
FIG. 35 shows a flowchart of a method for manufacturing a flexible display device according to a fifteenth exemplary embodiment of the present invention.
Figure 36:
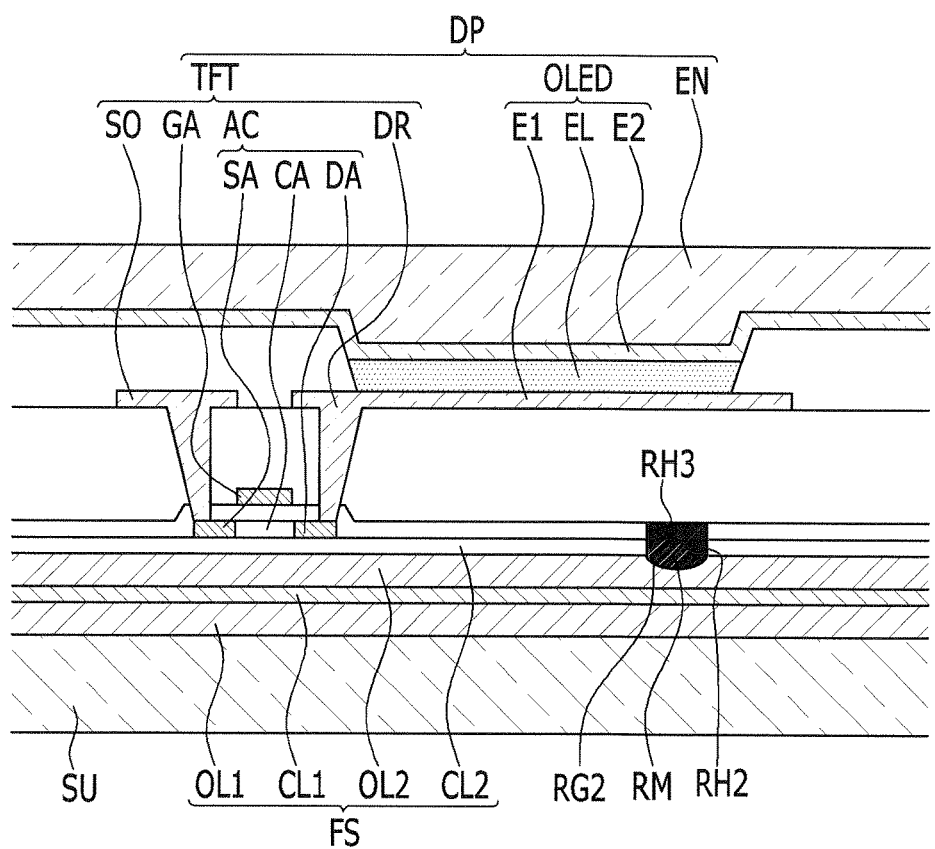
FIG. 36 shows a method for manufacturing a flexible display device according to a fifteenth exemplary embodiment of the present invention.

Referring to FIG. 35 and FIG. 36, a method for manufacturing a flexible display device according to a fifteenth exemplary embodiment of the present invention will now be described.

Parts that are different from the thirteenth exemplary embodiment will be described, and parts that are omitted follow the thirteenth exemplary embodiment. For better comprehension and ease of description, the same constituent elements as the thirteenth exemplary embodiment of the present invention will use the same reference numerals in the fifteenth exemplary embodiment of the present invention.

FIG. 35 shows a flowchart of a method for manufacturing a flexible display device according to a fifteenth exemplary embodiment of the present invention. FIG. 36 shows a method for manufacturing a flexible display device according to a fifteenth exemplary embodiment of the present invention.

As shown in FIG. 35 and FIG. 36, a first organic layer (OL1) may be formed on the substrate (SU) (S1510).

A first inorganic layer (CL1) may be formed on the first organic layer (OL1) (S1520).

A second organic layer (OL2) may be formed on the first inorganic layer (CL1) (S1530).

A second inorganic layer (CL2) may be formed on the second organic layer (OL2) (S1540).

The flexible substrate (FS) may be formed according to the above-noted method.

A polysilicon layer (PS) may be formed on the second inorganic layer (CL2) (S1550).

The bubbles (BU) formed on the polysilicon layer (PS) are removed to form a recessed second repair groove (RG2) on the second organic layer (OL2), a second repair hole (RH2) for exposing the second repair groove (RG2) in the second inorganic layer (CL2), and a third repair hole for exposing the second repair groove (RG2) in the polysilicon layer (PS) (S1560).

The second repair groove (RG2) may be filled with a repair material (RM) (S1570).

In detail, the recessed second repair groove (RG2) may be filled with the repair material (RM) including a metal, an organic material, or an inorganic material by using the coating process or the deposition process. The second repair hole (RH2) and the third repair hole are filled with the repair material (RM). Therefore, the display (DP) formed on the repair material (RM) will be formed to be flat.

A polysilicon layer (PS) may be patterned to form an active layer (AC) (S1580).

A part of the polysilicon layer (PS) in which the third repair hole may be formed is removed.

When the third repair hole may be formed in another part of the polysilicon layer (PS) to be formed as an active layer (AC), the active layer (AC) includes the third repair hole.

An organic light emitting diode (OLED) connected to the active layer (AC) may be formed (S1590).

The substrate (SU) may be removed from the first organic layer (OL1) (S1595).

A flexible display device according to a sixteenth exemplary embodiment of the present invention to be described is manufactured according to the above-noted process.

As described, when the bubbles (BU) are formed on the initial flexible substrate (FS) by the foreign particles and the bubbles (BU) are formed on the polysilicon layer (PS) formed as an active layer (AC), the method for manufacturing a flexible display device according to the fifteenth exemplary embodiment of the present invention removes the bubbles (BU) from the polysilicon layer (PS) by using the laser beams (LA) and fills the removed part with the repair material (RM) thereby preventing generation of undesired defects on the flexible display device. Therefore, permeation of external moisture into the organic light emitting diode (OLED) caused by the undesired defects that are generated in the flexible display device is prevented so the life-span of the flexible display device is improved.

That is, the method for manufacturing a flexible display device with improved life-span according to the fifteenth exemplary embodiment of the present invention is provided.

Figure 37:
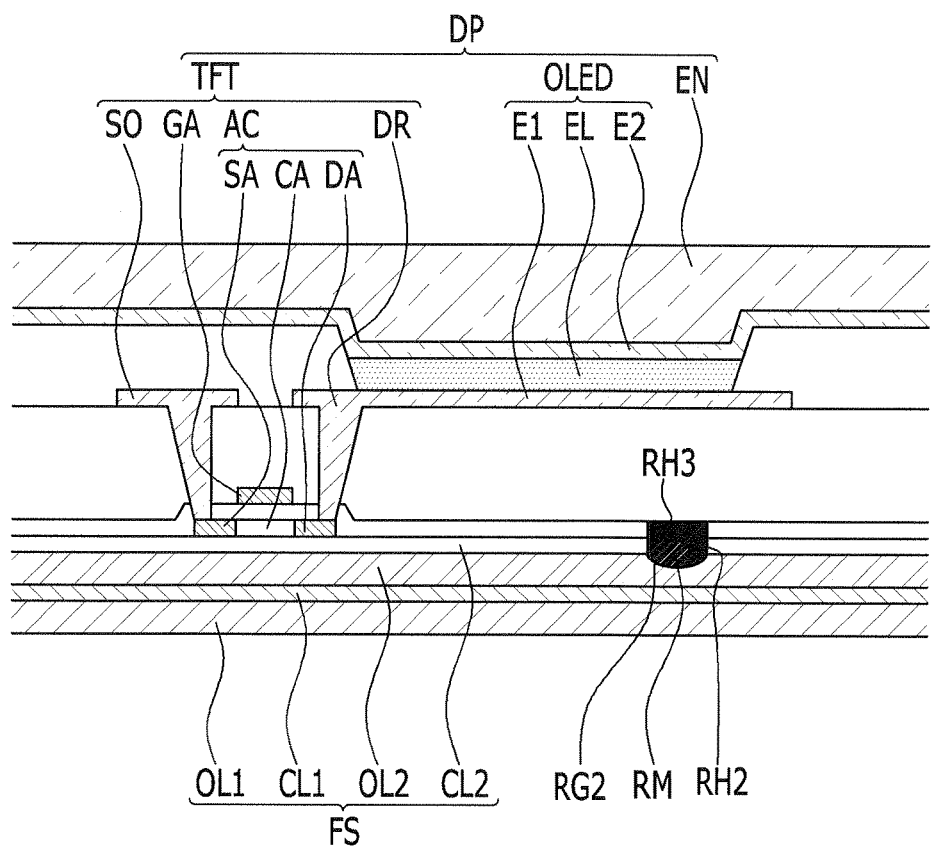
FIG. 37 shows a flexible display device according to a sixteenth exemplary embodiment of the present invention.

Referring to FIG. 37, a flexible display device according to a sixteenth exemplary embodiment of the present invention will now be described. The flexible display device according to the sixteenth exemplary embodiment of the present invention is manufactured by using the method for manufacturing a flexible display device according to the fifteenth exemplary embodiment of the present invention.

Parts that are different from the second exemplary embodiment will be described, and parts that are omitted follow the second exemplary embodiment. For better comprehension and ease of description, the same constituent elements as the second exemplary embodiment of the present invention will use the same reference numerals in the sixteenth exemplary embodiment of the present invention.

FIG. 37 shows a flexible display device according to a sixteenth exemplary embodiment of the present invention.

As shown in FIG. 37, the flexible display device 1016 according to the sixteenth exemplary embodiment of the present invention is flexible, and it includes a flexible substrate (FS), a display (DP), and a repair material (RM).

The repair material (RM) fills the second repair groove (RG2) through the second repair hole (RH2). That is, the repair material (RM) fills the second repair hole (RH2) and the second repair groove (RG2). As described, when the bubbles (BU) are formed on the polysilicon layer formed as an active layer (AC), the flexible display device 1016 according to the sixteenth exemplary embodiment of the present invention removes the bubbles (BU) from the polysilicon layer by using the laser beams (LA), the second organic layer (OL2), the second inorganic layer (CL2), and active layer (AC) respectively include the second repair groove (RG2), the second repair hole (RH2), and the third repair hole (RH3), and the second repair groove (RG2) is filled with the repair material (RM) thereby preventing generation of undesired defects on the flexible display device 1016 by the bubbles (BU). Therefore, permeation of external moisture into the organic light emitting diode (OLED) caused by the undesired defects that are generated in the flexible display device 1016 is prevented so the life-span of the flexible display device 1016 is improved.

That is, the flexible display device 1016 from which the bubbles (BU) are removed and of which the life-span is improved when the bubbles (BU) are formed on the polysilicon layer of the flexible display device 1016 according to the sixteenth exemplary embodiment of the present invention is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a flexible display device, comprising:
    manufacturing a flexible substrate on a substrate by:
        forming a first organic layer on the substrate;
        removing foreign particles formed on the first organic layer and forming a recessed first repair groove in the first organic layer;
        forming a first inorganic layer on the first organic layer;
        forming a second organic layer on the first inorganic layer; and
        forming a second inorganic layer on the second organic layer;
    forming a display for displaying an image on the flexible substrate; and
    removing the substrate from the first organic layer.

2. The method of claim 1, wherein
    the forming of the display is performed by forming an organic light emitting diode on the flexible substrate.

3. The method of claim 1, wherein
    the removing of foreign particles is performed by irradiating laser beams on the first organic layer.

4. The method of claim 1 wherein
    the forming of the first organic layer on the substrate is performed by coating an organic material on the substrate, and
    the forming of the first inorganic layer on the first organic layer is performed by depositing an inorganic material on the first organic layer.

5. The method of claim 1, further comprising: filling the first repair groove with a repair material.

6. A method for manufacturing a flexible display device, comprising:
    manufacturing a flexible substrate on a substrate by;
        forming a first organic layer on the substrate;
        forming a first inorganic layer on the first organic layer;
        forming a recessed first repair groove in the first organic layer and a first repair hole for exposing the first repair groove in the first inorganic layer by removing foreign particles provided on the first inorganic layer;
        forming a second organic layer on the first inorganic layer; and
        forming a second inorganic layer on the second organic layer;
    forming a display for displaying an image on the flexible substrate; and
    removing the substrate from the first organic layer.

7. The method of claim 6, wherein
    the removing of foreign particles is performed by irradiating laser beams on the first inorganic layer.

8. The method of claim 6, further comprising:
    filling the first repair groove with a repair material.

9. A method for manufacturing a flexible display device, comprising:
    manufacturing a flexible substrate on a substrate by:
        forming a first organic layer on the substrate;
        forming a first inorganic layer on the first organic layer;
        forming a second organic layer on the first inorganic layer;
        forming a second inorganic layer on the second organic layer; and
        forming a recessed second repair groove in the second organic layer and a second repair hole for exposing the second repair groove in the second inorganic layer by removing the bubbles formed on the second inorganic layer;
    forming a display for displaying an image on the flexible substrate; and
    removing the substrate from the first organic layer.

10. The method of claim 9, wherein
    the removing of bubbles is performed by irradiating laser beams on the second inorganic layer.

11. The method of claim 9, further comprising:
    filling the second repair groove with a repair material.

12. A method for manufacturing a flexible display device, comprising:

manufacturing a flexible substrate on a substrate by:
   forming a first organic layer on the substrate;
   forming a first inorganic layer on the first organic layer;
   forming a second organic layer on the first inorganic layer; and
   forming a second inorganic layer on the second organic layer;

forming a polysilicon layer on the second inorganic layer;

removing bubbles formed on the polysilicon layer and forming a recessed second repair groove in the second organic layer, a second repair hole for exposing the second repair groove in the second inorganic layer, and a third repair hole for exposing the second repair groove in the polysilicon layer;

forming an active layer by patterning the polysilicon layer;

forming an organic light emitting diode connected to the active layer; and removing the substrate from the first organic layer.

13. The method of claim 12, wherein
the removing of bubbles is performed by irradiating laser beams on the polysilicon layer.

14. The method of claim 12, further comprising:
filling the second repair groove with a repair material.

\* \* \* \* \*